(12) United States Patent
Sakai et al.

(10) Patent No.: US 10,608,107 B2
(45) Date of Patent: Mar. 31, 2020

(54) SILICON CARBIDE SEMICONDUCTOR DEVICE

(71) Applicant: Sumitomo Electric Industries, Ltd., Osaka-shi (JP)

(72) Inventors: Mitsuhiko Sakai, Osaka (JP); Toru Hiyoshi, Osaka (JP); So Tanaka, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/095,532

(22) PCT Filed: Feb. 27, 2017

(86) PCT No.: PCT/JP2017/007296
§ 371 (c)(1),
(2) Date: Oct. 22, 2018

(87) PCT Pub. No.: WO2017/183301
PCT Pub. Date: Oct. 26, 2017

(65) Prior Publication Data
US 2019/0172943 A1 Jun. 6, 2019

(30) Foreign Application Priority Data

Apr. 22, 2016 (JP) .................. 2016-086255

(51) Int. Cl.
*H01L 29/78* (2006.01)
*H01L 29/16* (2006.01)
(Continued)

(52) U.S. Cl.
CPC ...... *H01L 29/7813* (2013.01); *H01L 29/0615* (2013.01); *H01L 29/0619* (2013.01);
(Continued)

(58) Field of Classification Search
None
See application file for complete search history.

(56) References Cited

U.S. PATENT DOCUMENTS

| 8,686,435 B2 * | 4/2014 | Masuda ............. H01L 21/3065 |
| | | 257/77 |
| 2011/0024831 A1 * | 2/2011 | Nakano ............. H01L 29/0623 |
| | | 257/330 |

(Continued)

FOREIGN PATENT DOCUMENTS

WO    2012/017798 A1    2/2012

*Primary Examiner* — Reema Patel
*Assistant Examiner* — Steven M Christopher
(74) *Attorney, Agent, or Firm* — Baker Botts L.L.P.; Michael A. Sartori

(57) ABSTRACT

A silicon carbide substrate includes a first impurity region, a second impurity region in contact with the first impurity region and having p type, a third impurity region on the first impurity region and the second impurity region and having n type, a body region, and a source region. A gate insulating film is in contact with the source region, the body region and the third impurity region at a side surface, and in contact with the third impurity region at a bottom surface. When viewed in a direction perpendicular to a main surface, the second impurity region contains the bottom surface, and an area of the second impurity region is greater than an area of the bottom surface, and is not more than three times the area of the bottom surface. An impurity concentration of the second impurity region exceeds $1\times10^{19}$ cm$^{-3}$, and is not more than $1\times10^{21}$ cm$^{-3}$.

7 Claims, 23 Drawing Sheets

(51) Int. Cl.
*H01L 29/872* (2006.01)
*H01L 29/06* (2006.01)
*H01L 29/12* (2006.01)
H01L 29/47 (2006.01)
H01L 29/04 (2006.01)

(52) U.S. Cl.
CPC .......... *H01L 29/0623* (2013.01); *H01L 29/12* (2013.01); *H01L 29/1608* (2013.01); *H01L 29/78* (2013.01); *H01L 29/872* (2013.01); H01L 29/045 (2013.01); H01L 29/47 (2013.01)

(56) References Cited

U.S. PATENT DOCUMENTS

| | | | |
|---|---|---|---|
| 2013/0112996 A1 | 5/2013 | Masuda | |
| 2013/0306983 A1* | 11/2013 | Nakano | H01L 29/0623 257/76 |
| 2014/0252374 A1* | 9/2014 | Wada | H01L 29/1608 257/77 |
| 2017/0141223 A1* | 5/2017 | Hoshi | H01L 29/7813 |
| 2018/0175147 A1* | 6/2018 | Ohse | H01L 29/66068 |
| 2018/0197983 A1* | 7/2018 | Kinoshita | H01L 29/78 |

\* cited by examiner

SILICON CARBIDE SEMICONDUCTOR DEVICE

TECHNICAL FIELD

The present disclosure relates to silicon carbide semiconductor devices. The present application claims priority to Japanese Patent Application No. 2016-086255 filed on Apr. 22, 2016, the entire contents of which are incorporated herein by reference.

BACKGROUND ART

WO 2012/017798 (PTL 1), for example, describes a trench type MOSFET (Metal Oxide Semiconductor Field Effect Transistor) having a trench provided in a surface of a breakdown voltage holding layer.

CITATION LIST

Patent Literature

PTL 1: WO 2012/017798

SUMMARY OF INVENTION

A silicon carbide semiconductor device according to one embodiment of the present disclosure includes a silicon carbide substrate and a gate insulating film. The silicon carbide substrate has a main surface. The gate insulating film is on the silicon carbide substrate. The silicon carbide substrate includes a first impurity region having n type, a second impurity region in contact with the first impurity region and having p type, a third impurity region, on the first impurity region and the second impurity region, having an impurity concentration higher than that of the first impurity region, and having n type, a body region on the third impurity region and having p type, and a source region, on the body region, separated from the third impurity region by the body region, and having n type. The main surface is provided with a trench defined by a side surface and a bottom surface continuous with the side surface. The gate insulating film is in contact with the source region, the body region and the third impurity region at the side surface, and is in contact with the third impurity region at the bottom surface. When viewed in a direction perpendicular to the main surface, the second impurity region contains the bottom surface, and an area of the second impurity region is greater than an area of the bottom surface, and is not more than three times the area of the bottom surface. An impurity concentration of the second impurity region exceeds $1\times10^{19}$ $cm^{-3}$, and is not more than $1\times10^{21}$ $cm^{-3}$.

DESCRIPTION OF EMBODIMENTS

Figure 1:
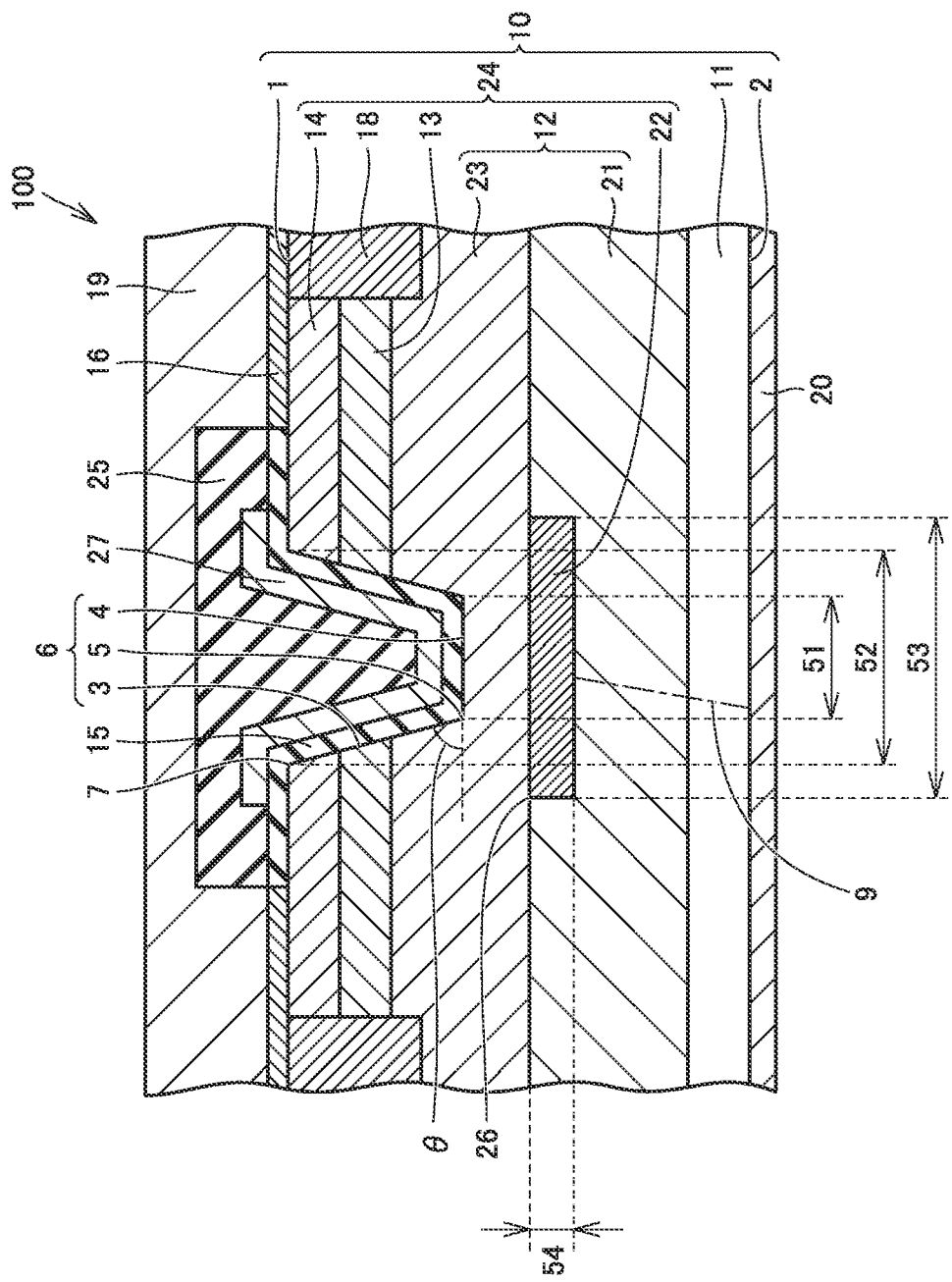
FIG. 1 is a schematic cross-sectional view taken along the line I-I in FIG. 2, showing a configuration of a silicon carbide semiconductor device according to the present embodiment.

Summary of Embodiment of the Present Disclosure

First, a summary of an embodiment of the present disclosure is provided. Regarding crystallographic denotation herein, an individual orientation, a group orientation, an individual plane, and a group plane are shown in [ ], < >, ( ), and { }, respectively. Although a crystallographically negative index is normally expressed by a number with a bar "-" thereabove, a negative sign herein precedes a number to indicate a crystallographically negative index.

(1) A silicon carbide semiconductor device 100 according to one embodiment of the present disclosure includes a silicon carbide substrate 10 and a gate insulating film 15. Silicon carbide substrate 10 has a main surface 1. Gate insulating film 15 is on silicon carbide substrate 10. Silicon carbide substrate 10 includes a first impurity region 21 having n type, a second impurity region 22 in contact with first impurity region 21 and having p type, a third impurity region 23, on first impurity region 21 and second impurity region 22, having an impurity concentration higher than that of first impurity region 21, and having n type, a body region 13 on third impurity region 23 and having p type, and a source region 14, on body region 13, separated from third impurity region 23 by body region 13, and having n type. Main surface 1 is provided with a trench 6 defined by a side surface 3 and a bottom surface 4 continuous with side surface 3. Gate insulating film 15 is in contact with source region 14, body region 13 and third impurity region 23 at side surface 3, and is in contact with third impurity region 23 at bottom surface 4. When viewed in a direction perpendicular to main surface 1, second impurity region 22 contains bottom surface 4, and an area of second impurity region 22 is greater than an area of bottom surface 4, and is not more than three times the area of bottom surface 4. An impurity concentration of second impurity region 22 exceeds $1 \times 10^{19}$ cm$^{-3}$, and is not more than $1 \times 10^{21}$ cm$^{-3}$.

When forming a silicon carbide layer on a silicon carbide single-crystal substrate by epitaxial growth, a threading screw dislocation present in the silicon carbide single-crystal substrate is transferred to the silicon carbide layer. As the silicon carbide layer grows, the threading screw dislocation extends in the silicon carbide layer. If the threading screw dislocation is exposed when reaching a bottom surface of a trench, the reliability of a gate insulating film formed on this bottom surface may be lowered.

The inventors found through extensive research that, by providing second impurity region 22 (that is, lattice disruption) to contain bottom surface 4 of trench 6, and setting the impurity concentration of second impurity region 22 to exceed $1 \times 10^{19}$ cm$^{-3}$ and at not more than $1 \times 10^{21}$ cm$^{-3}$, the extension of a threading screw dislocation 9 can be suppressed at second impurity region 22, to prevent threading screw dislocation 9 from reaching bottom surface 4 (see FIG. 1). As a result, the reliability of gate insulating film 15 formed on bottom surface 4 can be improved.

(2) In silicon carbide semiconductor device 100 according to (1) described above, when viewed in the direction perpendicular to main surface 1, an outer edge 26 of second impurity region 22 may be spaced from an outer edge 5 of bottom surface 4 around an entire periphery of bottom surface 4. The reliability of gate insulating film 15 can thus be further improved.

(3) In silicon carbide semiconductor device 100 according to (1) or (2) described above, a thickness 54 of second impurity region 22 in the direction perpendicular to main surface 1 may be not less than 0.7 μm. The reliability of gate insulating film 15 can thus be further improved.

(4) In silicon carbide semiconductor device 100 according to any one of (1) to (3) described above, in a direction parallel to main surface 1, a width 52 of opening 7 in trench 6 may be greater than a width 51 of bottom surface 4 and smaller than a width 53 of second impurity region 22. Second impurity region 22 thus contains opening 7 in trench 6, so that the threading screw dislocation can be prevented from reaching side surface 3 of trench 6. As a result, the reliability of gate insulating film 15 can be further improved.

(5) In silicon carbide semiconductor device 100 according to any one of (1) to (3) described above, in a direction parallel to main surface 1, a width 53 of second impurity region 22 may be greater than a width 51 of bottom surface 4 and smaller than a width 52 of opening 7 in trench 6. An excessive increase in the width of second impurity region 22 can thus be suppressed, so that the reliability of gate insulating film 15 can be improved while on-resistance is reduced.

Details of Embodiment of the Present Disclosure

An embodiment of the present disclosure (hereinafter referred to as the present embodiment) will be described below in detail based on the drawings. In the following drawings, the same or corresponding parts are designated by the same reference numbers and description thereof will not be repeated.

First, a configuration of a MOSFET as a silicon carbide semiconductor device according to the present embodiment is described.

As shown in FIG. 1, a MOSFET 100 according to the present embodiment mainly has a silicon carbide substrate 10, a gate insulating film 15, a gate electrode 27, an interlayer insulating film 25, a source electrode 16, a source wire 19, and a drain electrode 20. Silicon carbide substrate 10 includes a silicon carbide single-crystal substrate 11, and a silicon carbide epitaxial layer 24 provided on silicon carbide single-crystal substrate 11. Silicon carbide substrate 10 has a first main surface 1, and a second main surface 2 opposite to first main surface 1. Silicon carbide epitaxial layer 24 forms first main surface 1, and silicon carbide single-crystal substrate 11 forms second main surface 2.

First main surface 1 is a {000-1} plane or a plane angled off not less than 2° and not more than 8° relative to the {000-1} plane, for example. First main surface 1 is a (000-1) plane or a plane angled off not less than 2° and not more than 8° relative to the (000-1) plane, for example. Silicon carbide single-crystal substrate 11 and silicon carbide epitaxial layer 24 are made of hexagonal silicon carbide having a polytype of 4H, for example. Silicon carbide single-crystal substrate 11 includes an n type impurity such as nitrogen, and has n type conductivity. Silicon carbide epitaxial layer 24 mainly includes a drift region 12, a p type region 22, a body region 13, a source region 14, and a contact region 18.

Drift region 12 has a first impurity region 21 and a third impurity region 23. First impurity region 21 includes an n type impurity such as nitrogen, and has n type conductivity. The concentration of the n type impurity in first impurity region 21 is about $7\times10^{15}$ cm$^{-3}$, for example. The concentration of the n type impurity in silicon carbide single-crystal substrate 11 may be higher than the concentration of the n type impurity in first impurity region 21.

Third impurity region 23 includes an n type impurity such as nitrogen, and has n type conductivity. The concentration of the n type impurity in third impurity region 23 is higher than the concentration of the n type impurity in first impurity region 21. The concentration of the n type impurity in third impurity region 23 is about $3\times10^{16}$ cm$^{-3}$, for example. Third impurity region 23 is on first impurity region 21 and p type region 22. A bottom surface of third impurity region 23 is in contact with top surfaces of first impurity region 21 and p type region 22.

P type region 22 includes a p type impurity such as aluminum, and has p type conductivity. The concentration of the p type impurity in p type region 22 exceeds $1\times10^{19}$ cm$^{-3}$, and is not more than $1\times10^{21}$ cm$^{-3}$. The concentration of the p type impurity in p type region 22 may be not less than $5\times10^{19}$ cm$^{-3}$, or not less than $1\times10^{20}$ cm$^{-3}$, for example. The concentration of the p type impurity in p type region 22 may be not more than $5\times10^{20}$ cm$^3$, or not more than $1\times10^{20}$ cm$^3$. The concentration of the p type impurity can be measured by SIMS (Secondary Ion Mass Spectrometry), for example.

P type region 22 is in contact with first impurity region 21. Specifically, a bottom surface and a side surface of p type region 22 are in contact with first impurity region 21, and the top surface of p type region 22 is in contact with third impurity region 23. Stated another way, p type region 22 is sandwiched between first impurity region 21 and third impurity region 23. A thickness 54 of second impurity region 22 in a direction perpendicular to first main surface 1 is not less than 0.7 μm, for example, preferably not less than 0.3 μm, and more preferably not less than 0.5 μm. While the upper limit of thickness 54 of second impurity region 22 is not particularly limited, thickness 54 of second impurity region 22 is not more than 1.5 μm, for example.

Body region 13 is on third impurity region 23. A bottom surface of body region 13 is in contact with a top surface of third impurity region 23. Body region 13 includes a p type impurity such as aluminum, and has p type conductivity. The concentration of the p type impurity in body region 13 may be lower than the concentration of the n type impurity in third impurity region 23. A channel can be formed in a region of body region 13 which faces gate insulating film 15.

Source region 14 is on body region 13. A bottom surface of source region 14 is in contact with a top surface of body region 13. Source region 14 is separated from third impurity region 23 by body region 13. Source region 14 includes an n type impurity such as nitrogen or phosphorus, and has n type conductivity. Source region 14 forms part of first main surface 1 of silicon carbide substrate 10. The concentration of the n type impurity in source region 14 may be higher than the concentration of the n type impurity in third impurity region 23.

Contact region 18 is in contact with body region 13 and source region 14. Contact region 18 includes a p type impurity such as aluminum, and has p type conductivity. The concentration of the p type impurity included in contact region 18 may be higher than the concentration of the p type impurity included in body region 13. Contact region 18 connects third impurity region 23 and first main surface 1. Contact region 18 is provided to extend through source region 14 and body region 13. In the direction perpendicular to first main surface 1, a bottom surface of contact region 18 is between the bottom surface of body region 13 and a bottom surface 4 of a trench 6.

First main surface 1 of silicon carbide substrate 10 is provided with trench 6 defined by a side surface 3 and bottom surface 4. Bottom surface 4 is continuous with side surface 3. Side surface 3 extends through body region 13 and source region 14 to reach third impurity region 23. Bottom surface 4 is situated in third impurity region 23. Preferably, an angle θ formed by side surface 3 and a plane along bottom surface 4 may be 90°, or less than 90°. Angle θ is 54.7°, for example.

In cross-sectional view (view as seen in a direction parallel to second main surface 2), side surface 3 may be titled such that the width of trench 6 tapers toward bottom surface 4. Side surface 3 is titled not less than 52° and not more than 72° relative to the (000-1) plane, for example. Side surface 3 may be substantially perpendicular to first main surface 1. Bottom surface 4 may be substantially parallel to first main surface 1. In cross-sectional view, trench 6 may have a U-shape or V-shape. Source region 14 and body region 13 are exposed at side surface 3 of trench 6. Third impurity region 23 is exposed at both side surface 3 and bottom surface 4 of trench 6.

Gate insulating film 15 is on silicon carbide substrate 10. Gate insulating film 15 is a thermal oxide film, for example. Gate insulating film 15 is made of a material including silicon dioxide, for example. The thickness of gate insulating film 15 is about 45 nm, for example. Gate insulating film 15 is in contact with source region 14, body region 13 and third impurity region 23 at side surface 3. Gate insulating film 15 is in contact with third impurity region 23 at bottom surface 4. Gate insulating film 15 may be in contact with source region 14 at first main surface 1.

Gate electrode 27 is provided on gate insulating film 15 within trench 6. Gate electrode 27 is made of polysilicon including an impurity, for example. Gate electrode 27 is provided to face source region 14, body region 13 and third impurity region 23.

Source electrode 16 is in contact with source region 14 and contact region 18 at first main surface 1. Source electrode 16 is made of a material including Ti, Al and Si, for example. Preferably, source electrode 16 is in ohmic contact with source region 14 and contact region 18. Source wire 19 is in contact with source electrode 16. Source wire 19 is made of a material including aluminum, for example.

Interlayer insulating film 25 is provided in contact with gate electrode 27 and gate insulating film 15. Interlayer insulating film 25 is made of a material including silicon dioxide, for example. Interlayer insulating film 25 electrically insulates gate electrode 27 and source electrode 16 from each other. Drain electrode 20 is in contact with silicon carbide single-crystal substrate 11 at second main surface 2, and is electrically connected to drift region 12. Drain electrode 20 is made of a material including NiSi or TiAlSi, for example.

Figure 2:
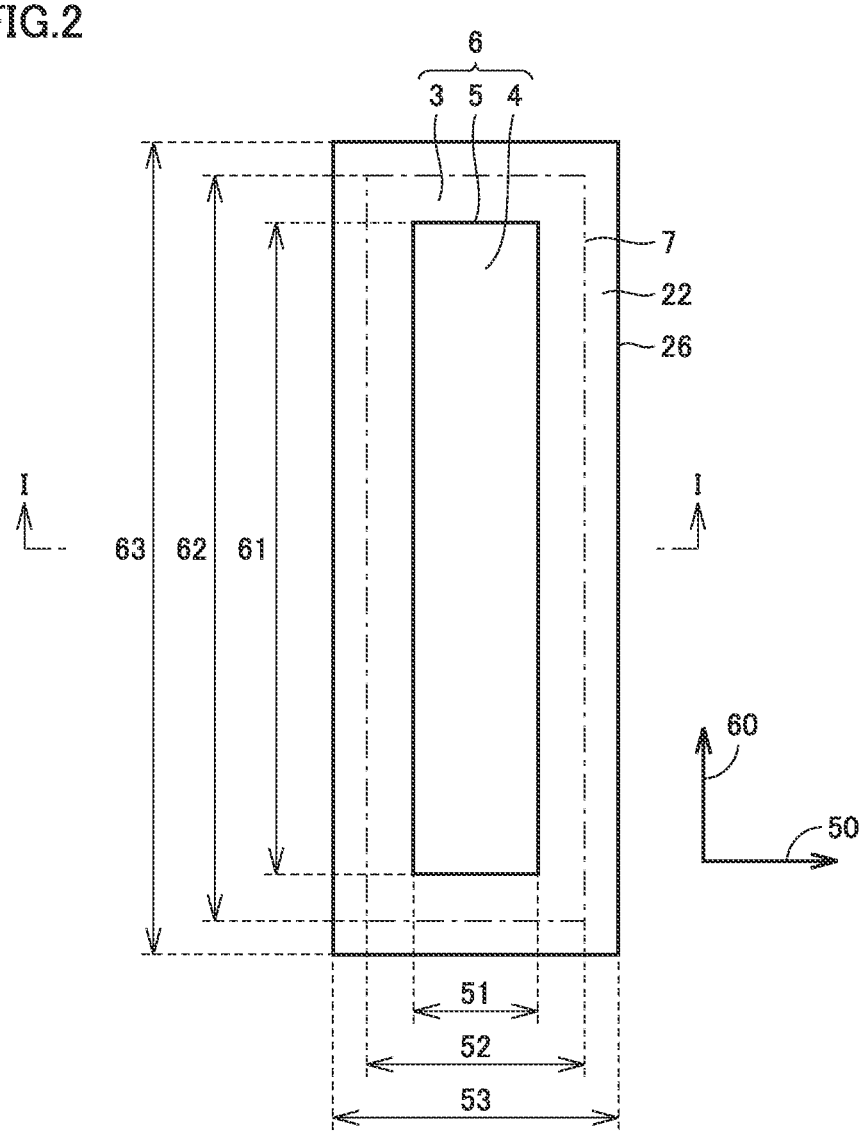
FIG. 2 is a schematic plan view showing relation between a second impurity region and a trench of the silicon carbide semiconductor device according to the present embodiment.

As shown in FIG. 2, when viewed in the direction perpendicular to first main surface 1, second impurity region 22, an opening 7 in trench 6, and bottom surface 4 each have a rectangular portion. Stated another way, second impurity region 22, opening 7 in trench 6, and bottom surface 4 each have a dimension in a longitudinal direction 60 and a dimension in a transverse direction 50. Longitudinal direction 60 and transverse direction 50 are substantially parallel to first main surface 1. Longitudinal direction 60 is substantially perpendicular to transverse direction 50.

As shown in FIGS. 1 and 2, in a direction parallel to first main surface 1, a width 52 of opening 7 in trench 6 may be greater than a width 51 of bottom surface 4 and smaller than a width 53 of second impurity region 22. Second impurity region 22 faces the entire bottom surface 4 and the entire side surface 3. Second impurity region 22 faces part of first main surface 1. Opening 7 in trench 6 is defined by a boundary portion between first main surface 1 and side surface 3.

As shown in FIG. 2, when viewed in the direction perpendicular to first main surface 1, second impurity region 22 contains bottom surface 4. When viewed in the direction perpendicular to first main surface 1, the area of second impurity region 22 is greater than the area of bottom surface 4, and is not more than three times the area of bottom surface 4. The area of second impurity region 22 may be not more than two and a half times, or not more than two times the area of bottom surface 4. Preferably, the area of second impurity region 22 is greater than the area of first main surface 1 which is surrounded by opening 7 in trench 6.

When viewed in the direction perpendicular to first main surface 1, an outer edge 26 of second impurity region 22 may be spaced from an outer edge 5 of bottom surface 4 around the entire periphery of bottom surface 4. Similarly, when viewed in the direction perpendicular to first main surface 1, outer edge 26 of second impurity region 22 may be spaced from an outer edge of opening 7 around the entire periphery of opening 7. Stated another way, when viewed in the direction perpendicular to first main surface 1, second impurity region 22 contains opening 7. In longitudinal direction 60 of second impurity region 22, a width 62 of opening 7 in trench 6 may be greater than a width 61 of bottom surface 4 and smaller than a width 63 of second impurity region 22.

(Variation 1)

Figure 3:
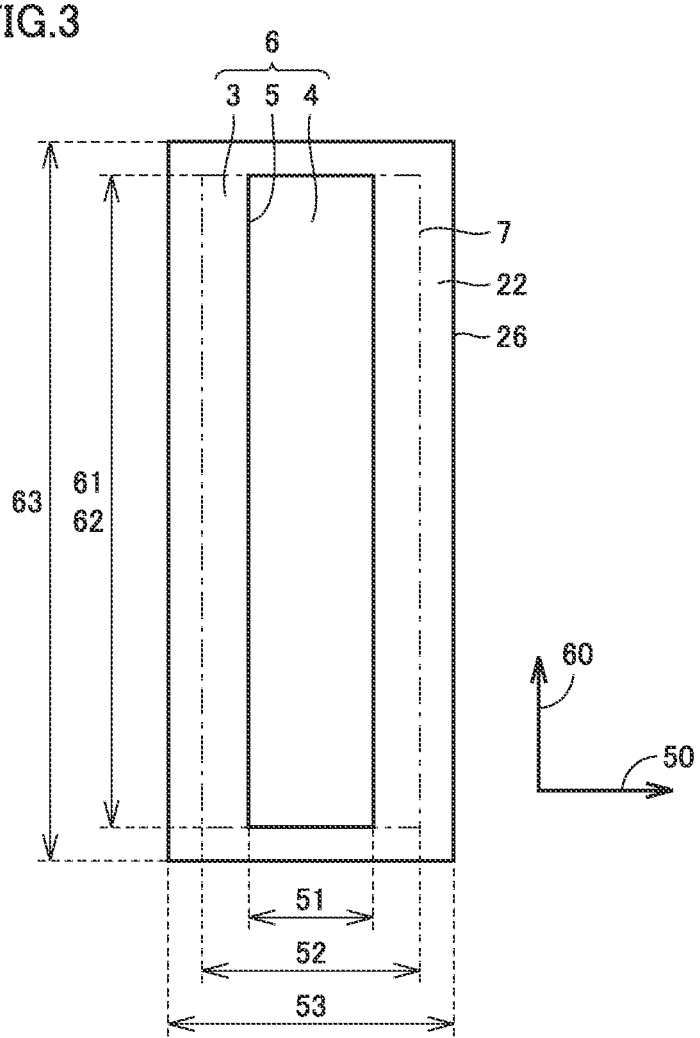
FIG. 3 is a schematic plan view showing relation between the second impurity region and the trench of the silicon carbide semiconductor device according to Variation 1.

Next, a configuration of MOSFET 100 according to Variation 1 is described. The configuration of MOSFET 100 according to Variation 1 is different from the configuration of the MOSFET shown in FIG. 1 in the following respects, and is otherwise substantially the same as the configuration of the MOSFET shown in FIG. 1. As shown in FIG. 3, in longitudinal direction 60 of second impurity region 22, width 62 of opening 7 in trench 6 may be substantially equal to width 61 of bottom surface 4. In longitudinal direction 60 of second impurity region 22, width 62 of opening 7 in trench 6 and width 61 of bottom surface 4 may be smaller than width 63 of second impurity region 22.

(Variation 2)

Figure 4:
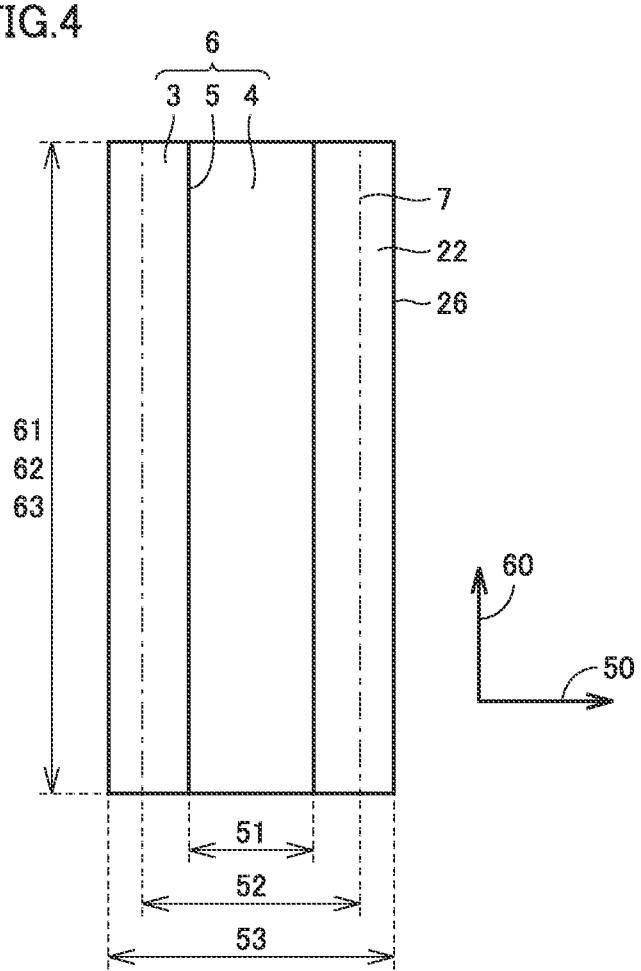
FIG. 4 is a schematic plan view showing relation between the second impurity region and the trench of the silicon carbide semiconductor device according to Variation 2.

Next, a configuration of MOSFET 100 according to Variation 2 is described. The configuration of MOSFET 100 according to Variation 2 is different from the configuration of the MOSFET shown in FIG. 1 in the following respects, and is otherwise substantially the same as the configuration of the MOSFET shown in FIG. 1. As shown in FIG. 4, in longitudinal direction 60 of second impurity region 22, width 62 of opening 7 in trench 6 may be substantially equal to width 63 of second impurity region 22. Similarly, in longitudinal direction 60 of second impurity region 22, width 61 of bottom surface 4 may be substantially equal to width 63 of second impurity region 22.

(Variation 3)

Figure 5:
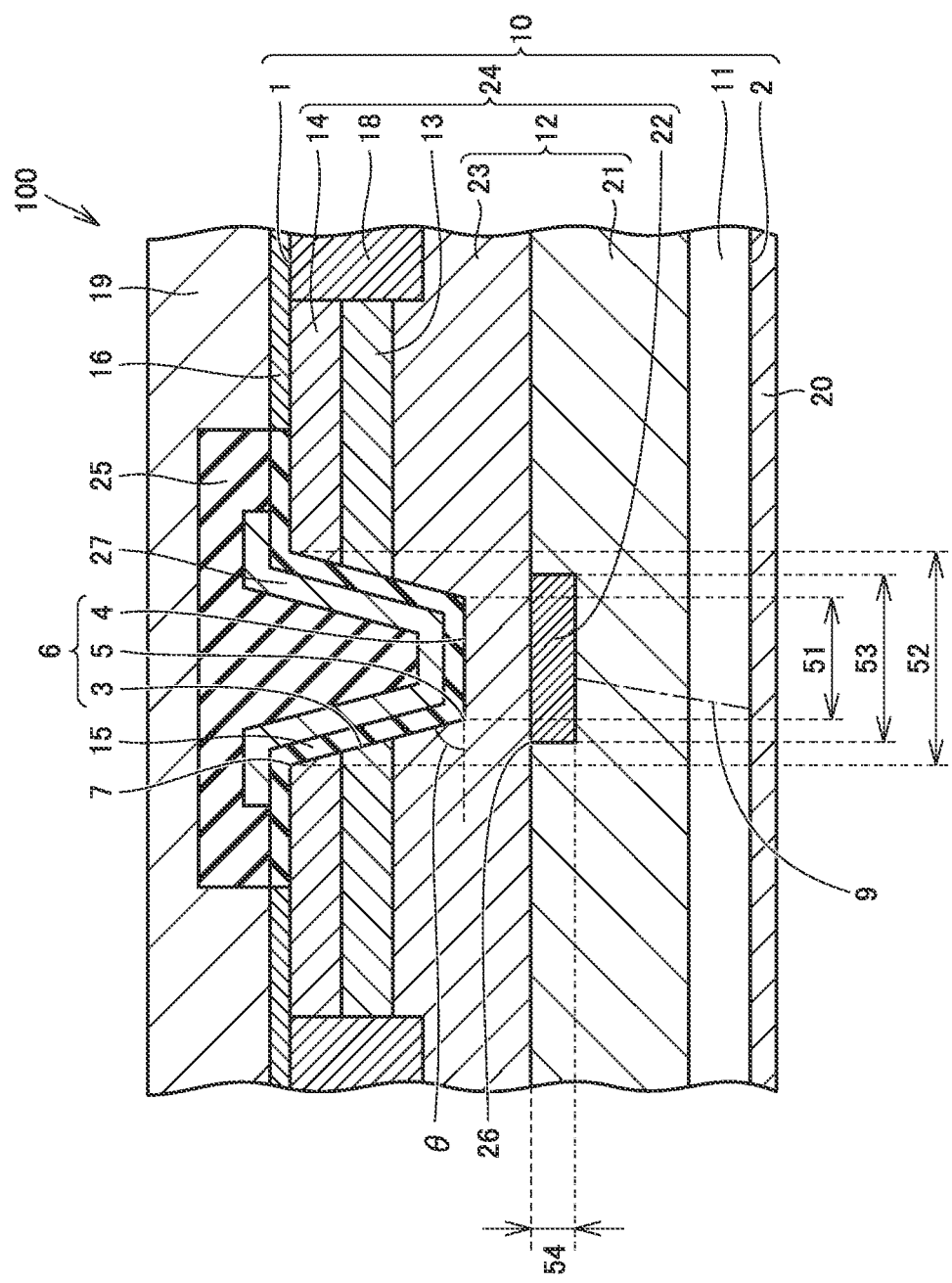
FIG. 5 is a schematic cross-sectional view showing a configuration of the silicon carbide semiconductor device according to Variation 3.

Next, a configuration of MOSFET 100 according to Variation 3 is described. The configuration of MOSFET 100 according to Variation 3 is different from the configuration of the MOSFET shown in FIG. 1 in the following respects, and is otherwise substantially the same as the configuration of the MOSFET shown in FIG. 1. As shown in FIG. 5, in the direction parallel to first main surface 1, width 53 of second impurity region 22 may be greater than width 51 of bottom surface 4 and smaller than width 52 of opening 7 in trench 6.

Figure 6:
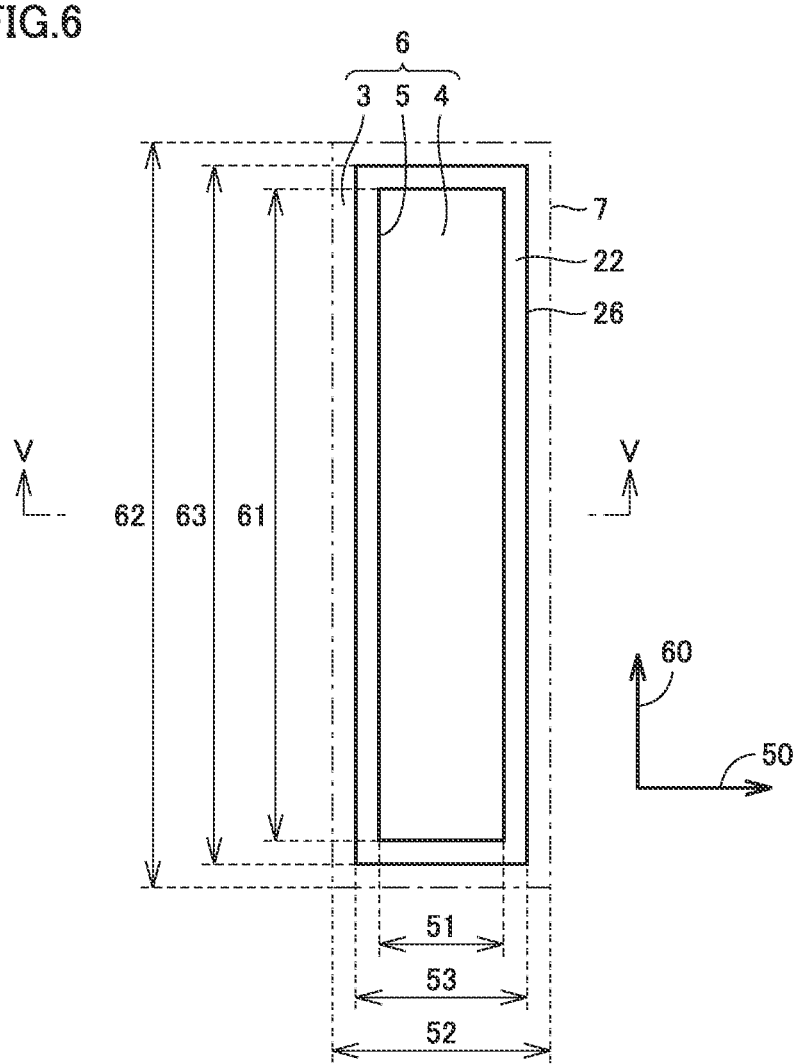
FIG. 6 is a schematic plan view showing relation between the second impurity region and the trench of the silicon carbide semiconductor device according to Variation 3.

As shown in FIG. 6, in longitudinal direction 60 of second impurity region 22, width 63 of second impurity region 22 may be smaller than width 62 of opening 7 in trench 6 and greater than width 61 of bottom surface 4. Similarly, in transverse direction 50 of second impurity region 22, width 63 of second impurity region 22 may be smaller than width 62 of opening 7 in trench 6 and greater than width 61 of bottom surface 4.

(Variation 4)

Figure 7:
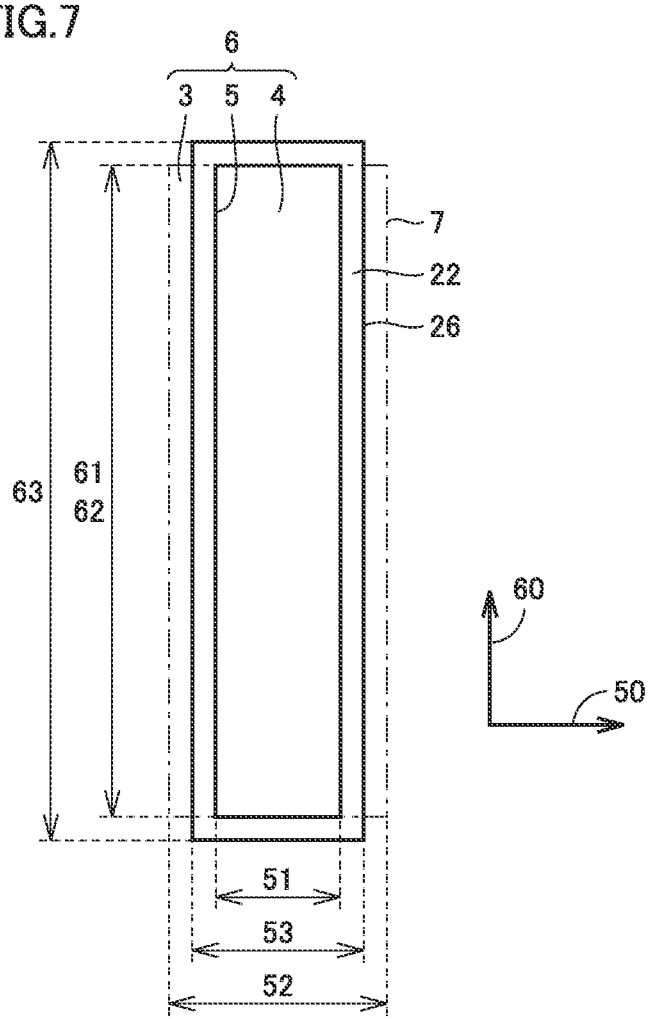
FIG. 7 is a schematic plan view showing relation between the second impurity region and the trench of the silicon carbide semiconductor device according to Variation 4.

Next, a configuration of MOSFET 100 according to Variation 4 is described. The configuration of MOSFET 100 according to Variation 4 is different from the configuration of the MOSFET shown in FIG. 5 in the following respects, and is otherwise substantially the same as the configuration of the MOSFET shown in FIG. 5. As shown in FIG. 7, in longitudinal direction 60 of second impurity region 22, width 63 of second impurity region 22 may be greater than width 62 of opening 7 in trench 6 and greater than width 61 of bottom surface 4. In longitudinal direction 60 of second impurity region 22, width 62 of opening 7 in trench 6 may be substantially equal to width 61 of bottom surface 4.

(Variation 5)

Figure 8:
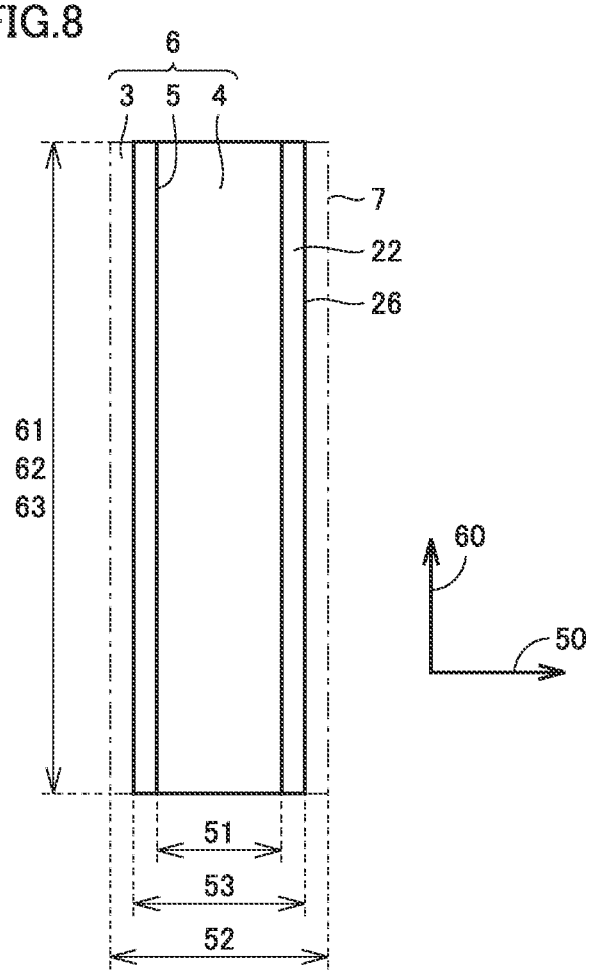
FIG. 8 is a schematic plan view showing relation between the second impurity region and the trench of the silicon carbide semiconductor device according to Variation 5.

Next, a configuration of MOSFET 100 according to Variation 5 is described. The configuration of MOSFET 100 according to Variation 5 is different from the configuration of the MOSFET shown in FIG. 5 in the following respects, and is otherwise substantially the same as the configuration of the MOSFET shown in FIG. 5. As shown in FIG. 8, in longitudinal direction 60 of second impurity region 22, width 63 of second impurity region 22 may be substantially equal to width 61 of bottom surface 4. In longitudinal direction 60 of second impurity region 22, width 62 of opening 7 in trench 6 may be substantially equal to width 61 of bottom surface 4.

(Variation 6)

Figure 9:
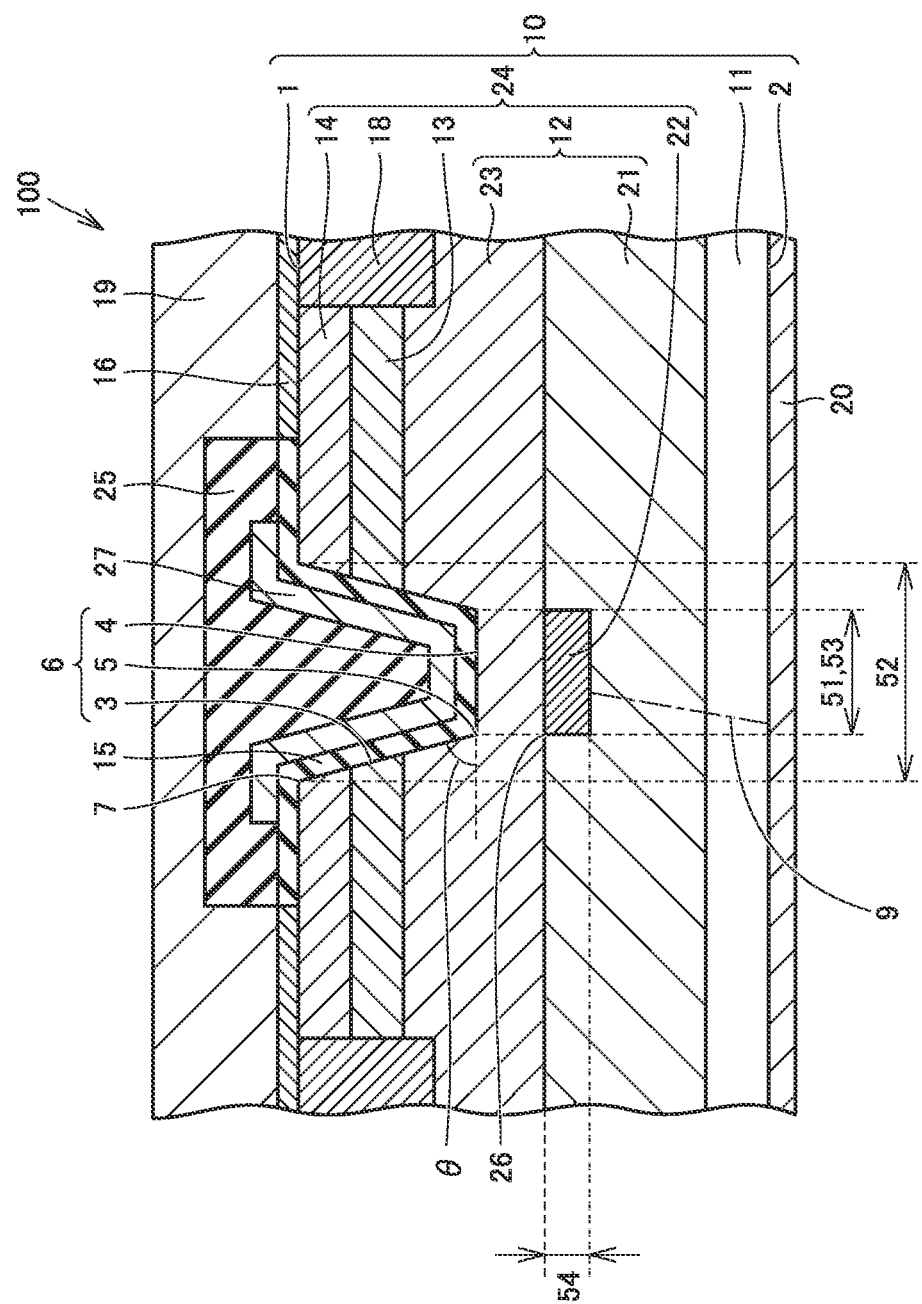
FIG. 9 is a schematic cross-sectional view showing a configuration of the silicon carbide semiconductor device according to Variation 6.

Next, a configuration of MOSFET 100 according to Variation 6 is described. The configuration of MOSFET 100 according to Variation 6 is different from the configuration of the MOSFET shown in FIG. 1 in the following respects, and is otherwise substantially the same as the configuration of the MOSFET shown in FIG. 1. As shown in FIG. 9, in the direction parallel to first main surface 1, width 53 of second impurity region 22 may be substantially equal to width 51 of bottom surface 4 and smaller than width 52 of opening 7 in trench 6.

Figure 10:
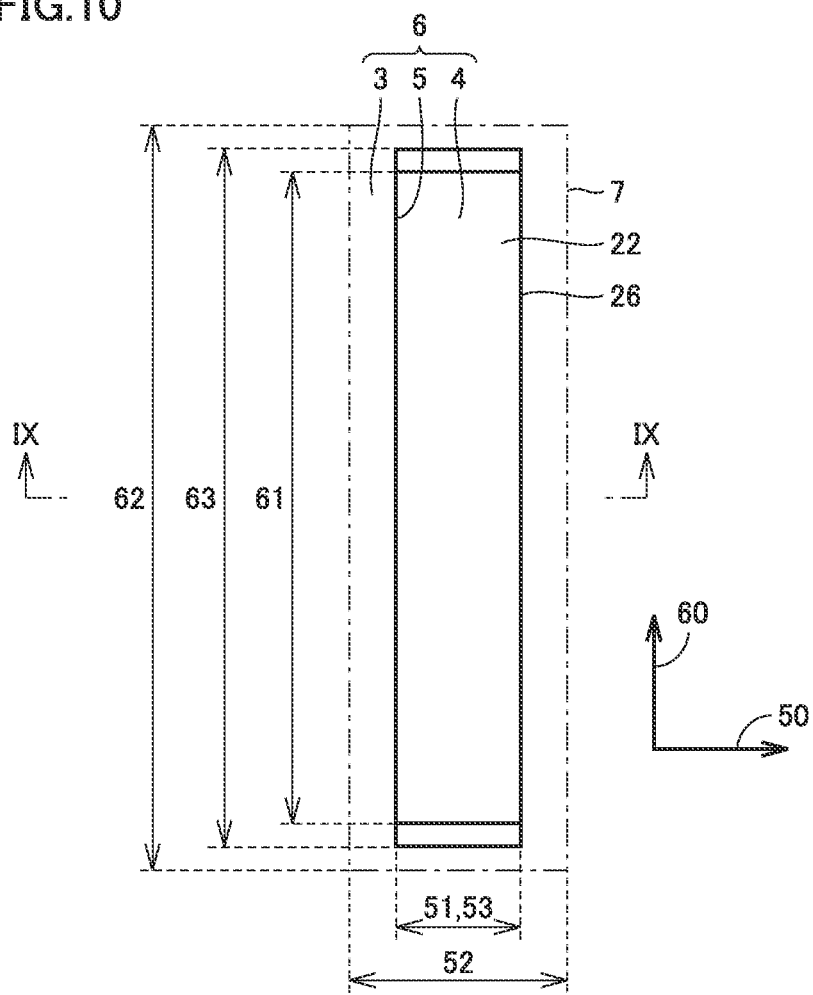
FIG. 10 is a schematic plan view showing relation between the second impurity region and the trench of the silicon carbide semiconductor device according to Variation 6.

As shown in FIG. 10, in longitudinal direction 60 of second impurity region 22, width 63 of second impurity region 22 may be smaller than width 62 of opening 7 in trench 6 and greater than width 61 of bottom surface 4. In transverse direction 50 of second impurity region 22, width 63 of second impurity region 22 may be smaller than width 62 of opening 7 in trench 6 and substantially equal to width 61 of bottom surface 4.

(Variation 7)

Figure 11:
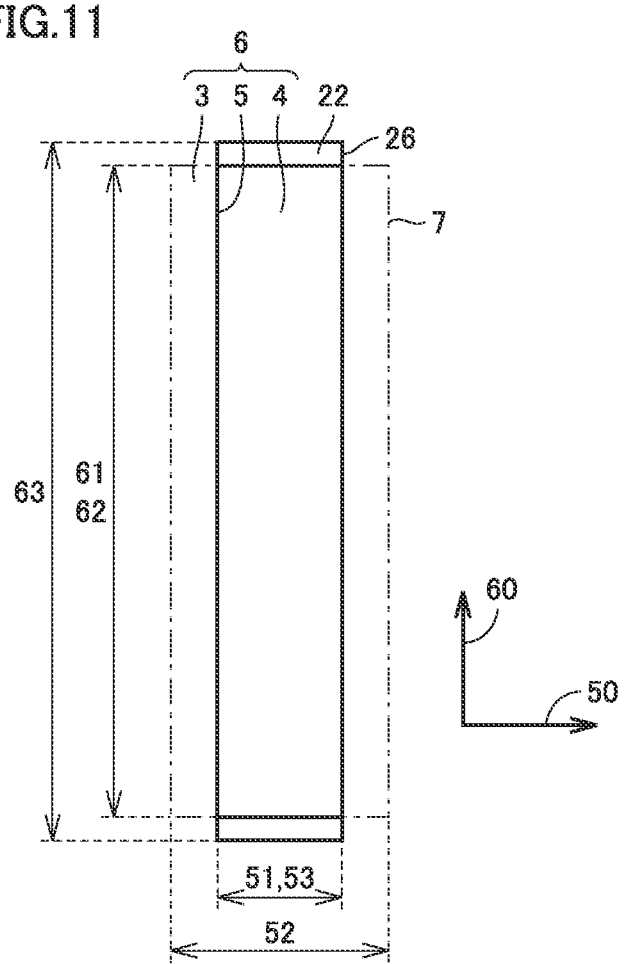
FIG. 11 is a schematic plan view showing relation between the second impurity region and the trench of the silicon carbide semiconductor device according to Variation 7.

Next, a configuration of MOSFET 100 according to Variation 7 is described. The configuration of MOSFET 100 according to Variation 7 is different from the configuration of the MOSFET shown in FIG. 9 in the following respects, and is otherwise substantially the same as the configuration of the MOSFET shown in FIG. 9. As shown in FIG. 11, in longitudinal direction 60 of second impurity region 22, width 63 of second impurity region 22 may be greater than width 62 of opening 7 in trench 6 and greater than width 61 of bottom surface 4. In longitudinal direction 60 of second impurity region 22, width 62 of opening 7 in trench 6 may be substantially equal to width 61 of bottom surface 4.

Although second impurity region 22 has been described above as having a rectangular portion, second impurity region 22 is not limited to have a rectangular portion. Second impurity region 22 may have a polygonal shape such as a hexagonal shape, or may have a honeycomb shape.

Next, a method of manufacturing MOSFET 100 according to the present embodiment is described.

Figure 12:
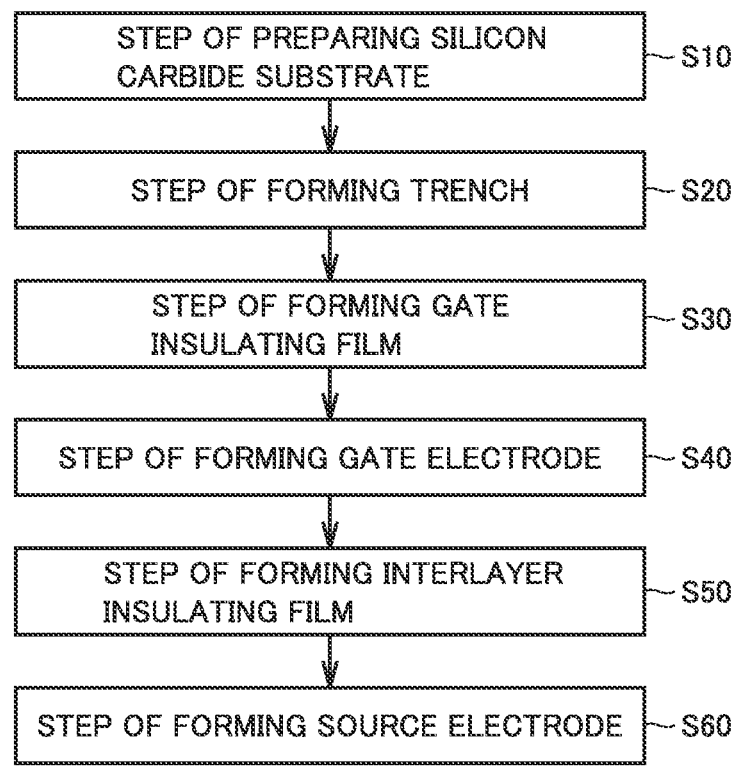
FIG. 12 is a flow diagram schematically showing a method of manufacturing the silicon carbide semiconductor device according to the present embodiment.
Figure 13:
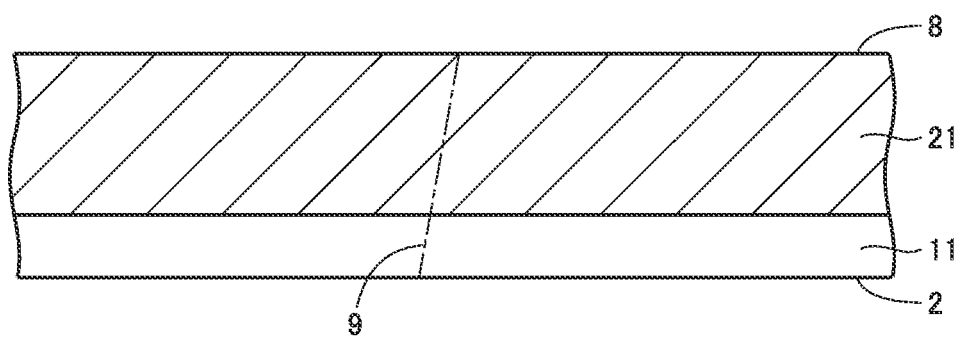
FIG. 13 is a schematic cross-sectional view showing a first step of the method of manufacturing the silicon carbide semiconductor device according to the present embodiment.

First, a step of preparing a silicon carbide substrate (S10: FIG. 12) is performed. Silicon carbide single-crystal substrate 11 is prepared by a sublimation process, for example. The silicon carbide single-crystal substrate has a maximum diameter of not less than 100 mm, for example, and preferably not less than 150 mm. First impurity region 21 is epitaxially grown on silicon carbide single-crystal substrate 11 by a CVD (Chemical Vapor Deposition) process which uses a mixed gas of silane ($SiH_4$) and propane ($C_3H_8$) as a source material gas, for example, hydrogen ($H_2$) gas as a carrier gas, for example, and ammonia ($NH_3$) as a dopant gas (see FIG. 13). The thickness of first impurity region 21 is 9 µm, for example. The concentration of nitrogen atoms included in first impurity region 21 is about $7 \times 10^{15}$ cm$^{-3}$, for example.

Figure 14:
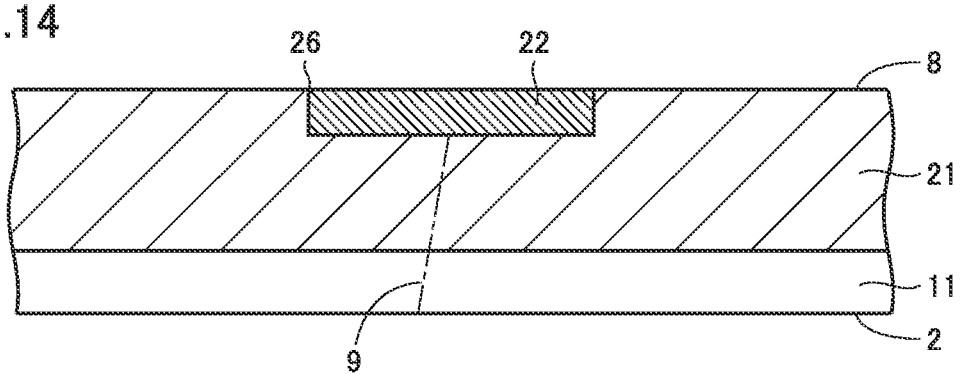
FIG. 14 is a schematic cross-sectional view showing a second step of the method of manufacturing the silicon carbide semiconductor device according to the present embodiment.

Then, a mask layer (not shown) is formed on a surface 8 of first impurity region 21. The mask layer has an opening over a region where p type region 22 is to be formed. Using this mask layer, ions of a p type impurity such as aluminum are implanted into surface 8 of first impurity region 21. P type region 22 exposed at surface 8 of first impurity region 21 is thus formed (see FIG. 14). The thickness of p type region 22 is not less than 0.7 µm and not more than 1 µm, for example. The concentration of the p type impurity in p type region 22 exceeds $1 \times 10^{19}$ cm$^{-3}$, and is not more than $1 \times 10^{21}$ cm$^{-3}$. The mask layer is then removed from surface 8 of first impurity region 21.

Figure 15:
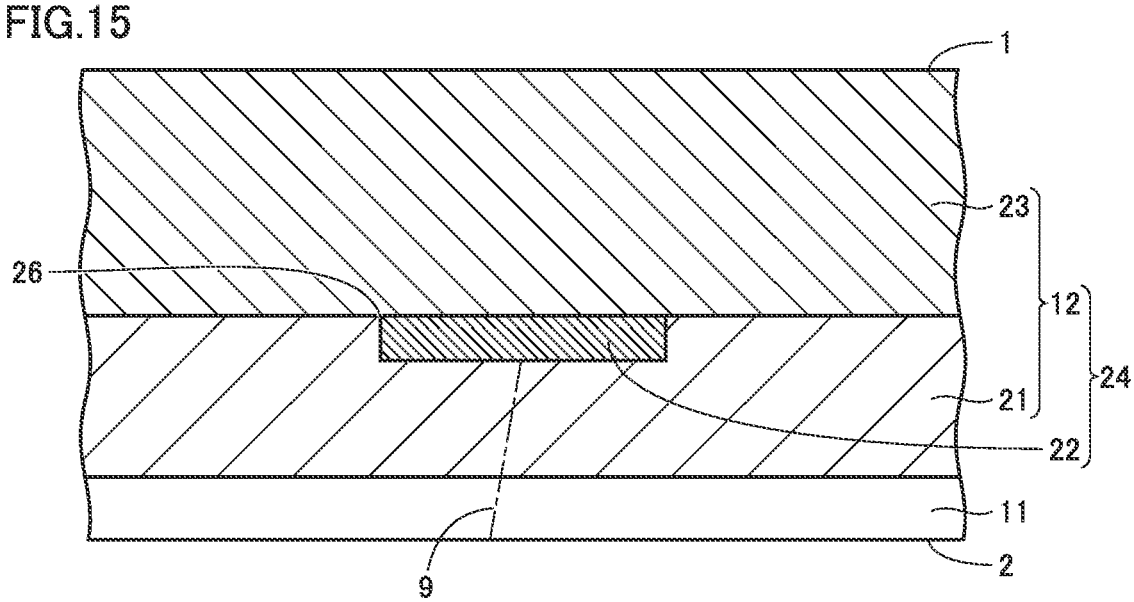
FIG. 15 is a schematic cross-sectional view showing a third step of the method of manufacturing the silicon carbide semiconductor device according to the present embodiment.

Then, third impurity region 23 is epitaxially grown on first impurity region 21 and p type region 22 by a CVD process which uses a mixed gas of silane and propane as a source material gas, for example, hydrogen gas as a carrier gas, for example, and ammonia as a dopant gas (see FIG. 15). The thickness of third impurity region 23 is 3 µm, for example. The concentration of nitrogen atoms included in third impurity region 23 is about $3 \times 10^{16}$ cm$^{-3}$, for example.

Figure 16:
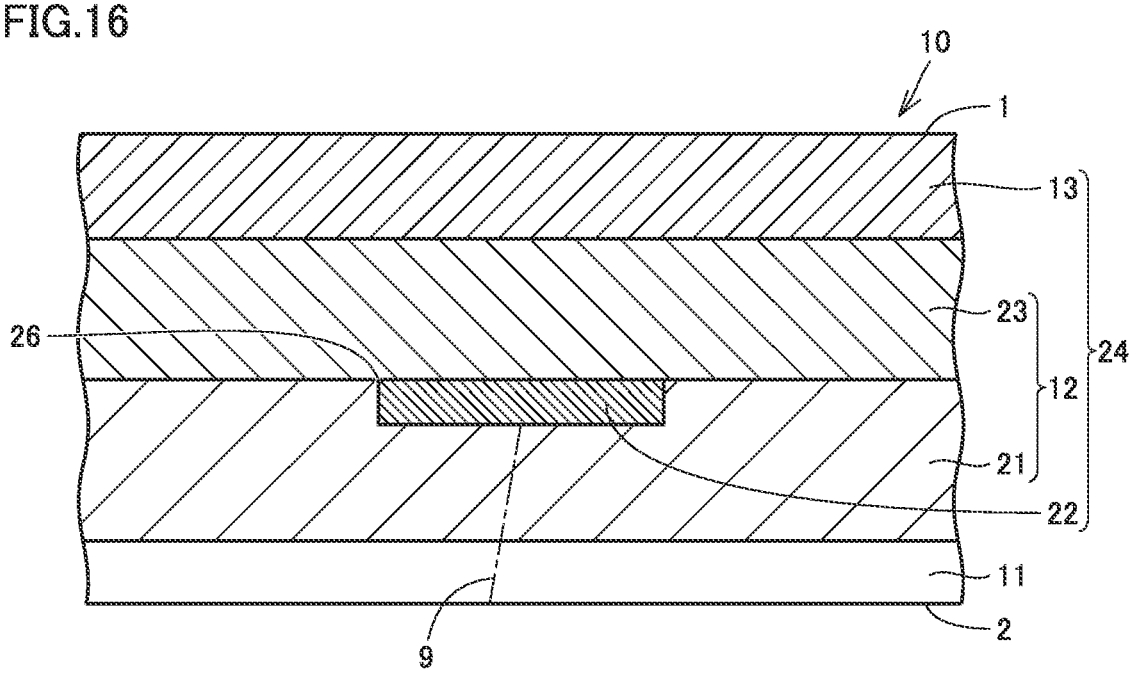
FIG. 16 is a schematic cross-sectional view showing a fourth step of the method of manufacturing the silicon carbide semiconductor device according to the present embodiment.
Figure 17:
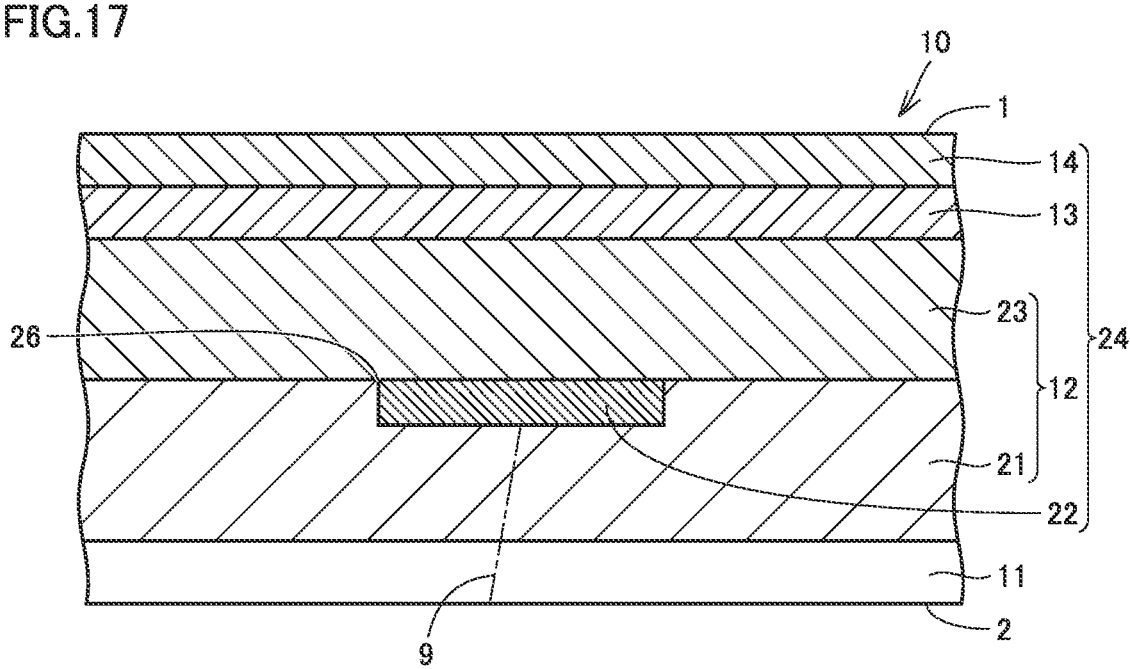
FIG. 17 is a schematic cross-sectional view showing a fifth step of the method of manufacturing the silicon carbide semiconductor device according to the present embodiment.

Then, an ion implantation step is performed. Ions of a p type impurity such as aluminum are implanted into a surface 1 of third impurity region 23. A p type layer 13 in contact with third impurity region 23 is thus formed (see FIG. 16). The thickness of p type layer 13 is 0.9 µm, for example. Then, ions of an n type impurity such as phosphorus are implanted into a surface 1 of p type layer 13. Source region 14 having n type conductivity is thus formed (see FIG. 17). The thickness source region 14 is 0.4 µm, for example. Source region 14 forms first main surface 1. The concentration of the n type impurity included in source region 14 is higher than the concentration of the p type impurity included in p type layer 13. Then, ions of a p type impurity such as aluminum are implanted into source region 14, to thereby form contact region 18. Contact region 18 is formed to extend through source region 14 and p type layer 13, and to be in contact with third impurity region 23. The concentration of the p type impurity included in contact region 18 is higher than the concentration of the n type impurity included in source region 14.

Then, activation annealing is performed for activating the impurities which have been ion-implanted into silicon carbide substrate 10. The activation annealing is preferably performed at not less than 1500° C. and not more than 1900° C., and at about 1700° C., for example. The activation annealing is performed for a period of about 30 minutes, for example. The activation annealing is preferably performed in an inert gas atmosphere, and in an Ar atmosphere, for example.

Then, a step of forming a trench (S20: FIG. 12) is performed. For example, a mask 17 having an opening over a position where trench 6 (FIG. 1) is to be formed is formed on first main surface 1 formed of source region 14 and contact region 18. Mask 17 is used to remove source region 14, body region 13, and part of third impurity region 23 by etching. Methods for etching that can be used include reactive ion etching, for example, and in particular, inductively coupled plasma reactive ion etching. Specifically, inductively coupled plasma reactive ion etching which uses $SF_6$ or a mixed gas of $SF_6$ and $O_2$ as a reactant gas can be employed. As a result of the etching, a recess having a side substantially perpendicular to first main surface 1 and a bottom provided continuously with the side and substantially parallel to first main surface 1 is formed in a region where trench 6 is to be formed.

Then, thermal etching is performed in the recess. The thermal etching may be performed, with mask 17 formed on first main surface 1, by heating in an atmosphere including reactive gas having at least one or more types of halogen atoms, for example. The at least one or more types of halogen atoms include at least one of chlorine (Cl) atoms and fluorine (F) atoms. This atmosphere includes $Cl_2$, $BCl_3$, $SF_6$ or $CF_4$, for example. The thermal etching is performed by using a mixed gas of chlorine gas and oxygen gas as a reactant gas, for example, and setting the heat treatment temperature at not less than 700° C. and not more than 1000° C., for example. It should be noted that the reactant gas may include a carrier gas in addition to the chlorine gas and the oxygen gas described above. Nitrogen gas, argon gas or helium gas can be used, for example, as the carrier gas.

Figure 18:
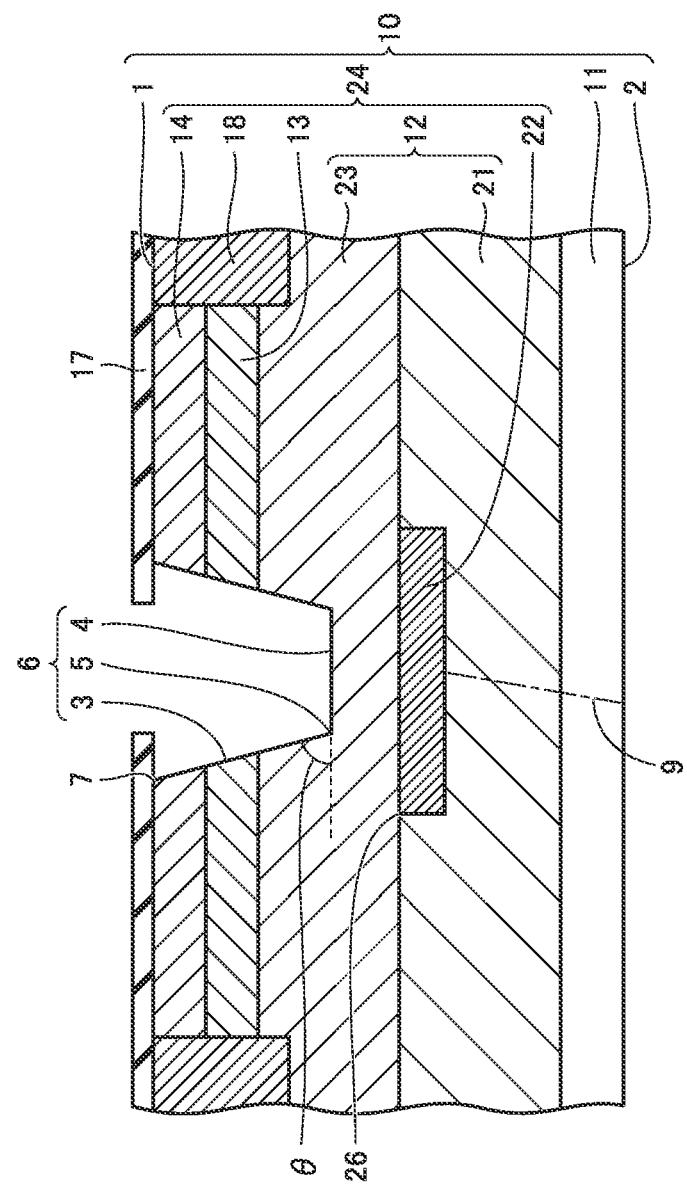
FIG. 18 is a schematic cross-sectional view showing a sixth step of the method of manufacturing the silicon carbide semiconductor device according to the present embodiment.

As a result of the thermal etching described above, trench 6 is formed in first main surface 1 of silicon carbide substrate 10 (see FIG. 18). Trench 6 is defined by side surface 3 and bottom surface 4. Side surface 3 is formed by source region 14, body region 13 and third impurity region 23. Bottom surface 4 is formed by third impurity region 23. Angle θ between side surface 3 and the plane along bottom surface 4 is 54.7°, for example. Mask 17 is then removed from first main surface 1.

Figure 19:
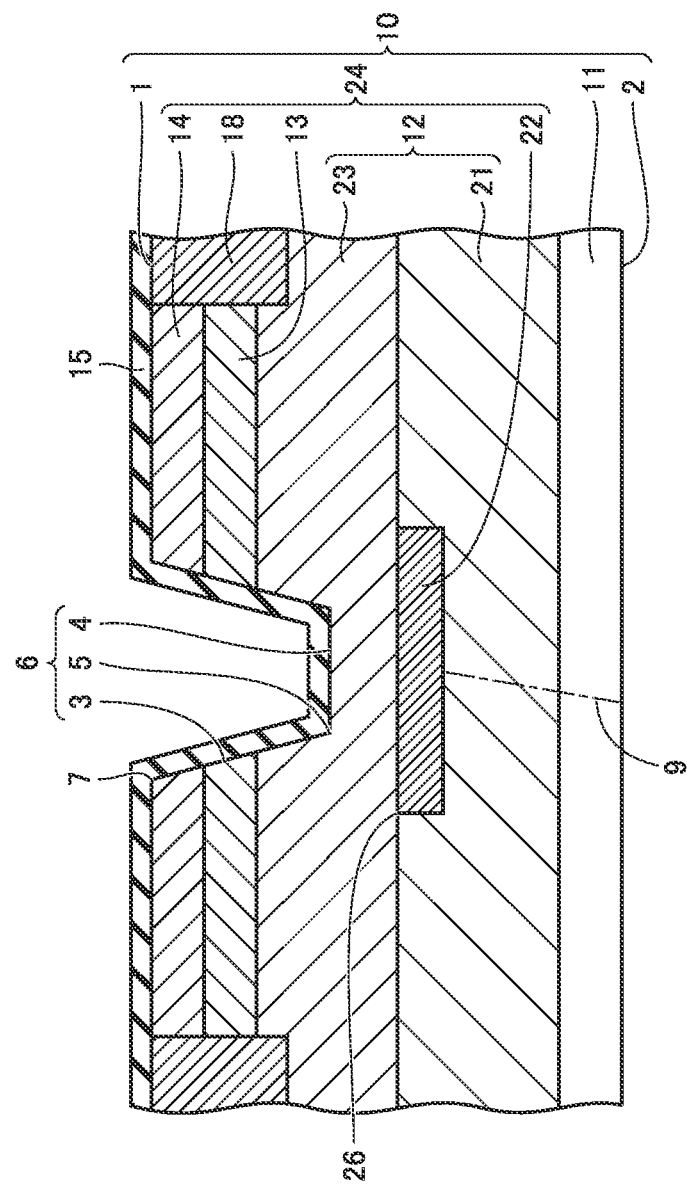
FIG. 19 is a schematic cross-sectional view showing a seventh step of the method of manufacturing the silicon carbide semiconductor device according to the present embodiment.

Then, a step of forming a gate insulating film (S30: FIG. 12) is performed. For example, silicon carbide substrate 10 is heated at a temperature of not less than 1300° C. and not more than 1400° C., for example, in an atmosphere including oxygen. Gate insulating film 15 is thus formed which is in contact with third impurity region 23 at bottom surface 4, in contact with third impurity region 23, body region 13 and source region 14 at side surface 3, and in contact with source region 14 at first main surface 1 (see FIG. 19).

After gate insulating film 15 has been formed by the thermal oxidation of silicon carbide substrate 10, heat treatment (NO annealing) may be performed on silicon carbide substrate 10 in a nitrogen monoxide (NO) gas atmosphere. During the NO annealing, silicon carbide substrate 10 is held for about one hour under a condition of not less than 1100° C. and not more than 1300° C., for example. Nitrogen atoms are thus introduced into an interface region between gate insulating film 15 and body region 13. As a result, the formation of an interface state in the interface region can be suppressed to improve channel mobility. Gas other than the NO gas (for example, $N_2O$) may be used as an atmospheric gas, as long as the nitrogen atoms can be introduced. After the NO annealing, Ar annealing which uses argon (Ar) as an atmospheric gas may be further performed. The Ar annealing is performed at a heating temperature equal to or higher than the heating temperature for the NO annealing described above, for example. The Ar annealing is performed for a period of about one hour, for example. The formation of an interface state in the interface region between gate insulating film 15 and body region 13 is thus further suppressed.

Then, a step of forming a gate electrode (S40: FIG. 12) is performed. For example, gate electrode 27 is formed which is in contact with gate insulating film 15 within trench 6. Gate electrode 27 is disposed within trench 6, and is formed to face each of side surface 3 and bottom surface 4 of trench 6 on gate insulating film 15. Gate electrode 27 is formed by a LPCVD (Low Pressure Chemical Vapor Deposition) process, for example.

Figure 20:
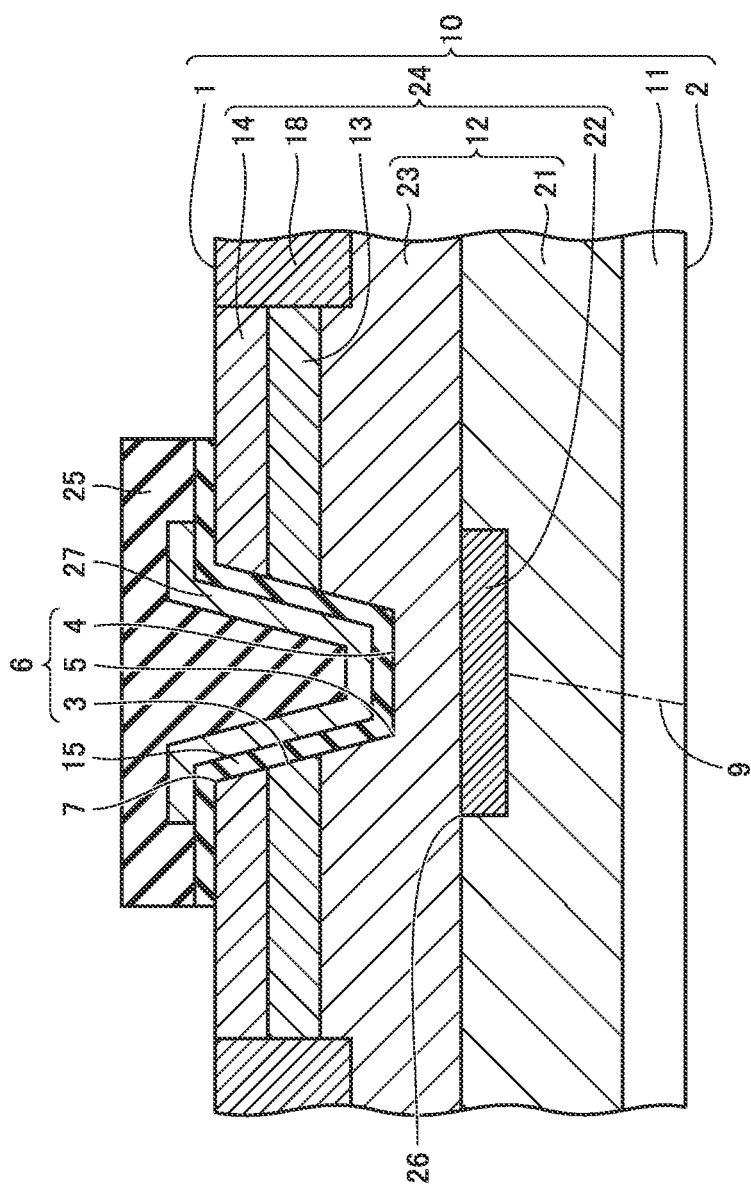
FIG. 20 is a schematic cross-sectional view showing an eighth step of the method of manufacturing the silicon carbide semiconductor device according to the present embodiment.

Then, a step of forming an interlayer insulating film (S50: FIG. 12) is performed. For example, interlayer insulating film 25 is formed to cover gate electrode 27 and to be in contact with gate insulating film 15. Preferably, interlayer insulating film 25 is formed by a deposition process, and more preferably by a chemical vapor deposition process. Interlayer insulating film 25 is made of a material including silicon dioxide, for example. Then, interlayer insulating film 25 and gate insulating film 15 are partially etched such that an opening is formed over source region 14 and contact region 18. Contact region 18 and source region 14 are thus exposed at gate insulating film 15 (see FIG. 20).

Then, a step of forming a source electrode (S60: FIG. 12) is performed. Then, source electrode 16 is formed which is in contact with source region 14 and contact region 18 at first main surface 1. Source electrode 16 is formed by a sputtering process, for example. Source electrode 16 is made of a material including Ti, Al and Si, for example. Alloying annealing is then performed. Specifically, source electrode 16 in contact with source region 14 and contact region 18 is held for about five minutes at a temperature of not less than 900° C. and not more than 1100° C., for example. Source electrode 16 thus at least partially reacts with silicon included in silicon carbide substrate 10 and is silicided. Source electrode 16 in ohmic contact with source region 14 is thus formed. Preferably, source electrode 16 is in ohmic contact with contact region 18.

Then, source wire 19 electrically connected to source electrode 16 is formed. Source wire 19 is formed on source electrode 16 and interlayer insulating film 25. Then, silicon carbide substrate 10 is back ground at second main surface 2. Silicon carbide substrate 10 is thus thinned. Then, drain electrode 20 is formed in contact with second main surface 2. MOSFET 100 according to the present embodiment (FIG. 1) is thereby manufactured.

Although the silicon carbide semiconductor device has been described as a MOSFET in the above embodiment, the silicon carbide semiconductor device is not limited to a MOSFET. The silicon carbide semiconductor device may be an IGBT (Insulated Gate Bipolar Transistor) or the like, for example.

Next, a function and effect of the MOSFET according to the present embodiment will be described.

In accordance with MOSFET 100 according to the present embodiment, p type region 22 is provided to contain bottom surface 4 of trench 6, and the concentration of aluminum atoms in p type region 22 exceeds $1 \times 10^{19}$ $cm^3$, and is not more than $1 \times 10^{21}$ $cm^{-3}$. The extension of a threading screw dislocation 9 can thus be suppressed at p type region 22, to prevent threading screw dislocation 9 from reaching bottom surface 4. In addition, electric field concentration at bottom surface 4 can be relaxed by the provision of p type region 22. As a result, the reliability of gate insulating film 15 formed on bottom surface 4 can be improved.

In accordance with MOSFET 100 according to the present embodiment, when viewed in the direction perpendicular to first main surface 1, outer edge 26 of second impurity region 22 is spaced from outer edge 5 of bottom surface 4 around the entire periphery of bottom surface 4. The reliability of gate insulating film 15 can thus be further improved.

Furthermore, in accordance with MOSFET 100 according to the present embodiment, thickness 54 of second impurity region 22 in the direction perpendicular to first main surface 1 is not less than 0.7 μm. The reliability of gate insulating film 15 can thus be further improved.

Furthermore, in accordance with MOSFET 100 according to the present embodiment, in the direction parallel to first main surface 1, width 52 of opening 7 in trench 6 is greater than width 51 of bottom surface 4 and smaller than width 53 of p type region 22. P type region 22 thus contains opening 7 in trench 6, so that threading screw dislocation 9 can be prevented from reaching side surface 3 of trench 6. As a result, the reliability of gate insulating film 15 can be further improved.

Furthermore, in accordance with MOSFET 100 according to the present embodiment, in the direction parallel to first main surface 1, width 53 of p type region 22 is greater than width 51 of bottom surface 4 and smaller than width 52 of opening 7 in trench 6. An excessive increase in the width of p type region 22 can thus be suppressed, so that the reliability of gate insulating film 15 can be improved while on-resistance is reduced.

(Variation 8)

Next, a configuration of silicon carbide semiconductor device 100 according to Variation 8 is described.

Figure 21:
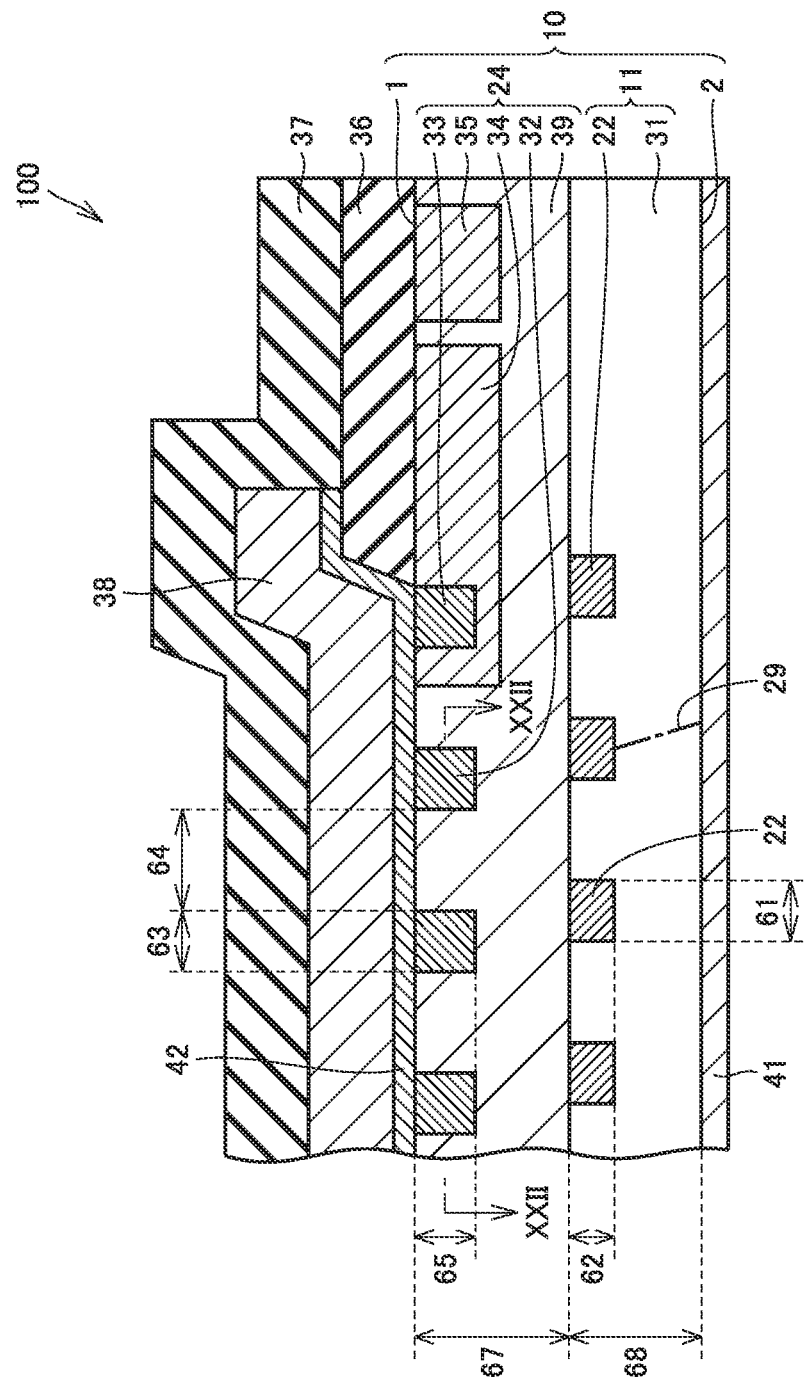
FIG. 21 is a schematic cross-sectional view showing a configuration of the silicon carbide semiconductor device according to Variation 8.

As shown in FIG. 21, silicon carbide semiconductor device 100 according to the present variation is a junction barrier Schottky diode (hereinafter referred to as JBS), and mainly has silicon carbide substrate 10, a Schottky electrode 42, a field oxide film 36, an anode electrode 38, a passivation film 37, and a cathode electrode 41. Silicon carbide substrate 10 is made of hexagonal silicon carbide having a polytype of 4H, for example. Silicon carbide substrate 10 includes silicon carbide single-crystal substrate 11 and silicon carbide epitaxial layer 24. Silicon carbide epitaxial layer 24 forms first main surface 1.

First main surface 1 is a plane titled at an off angle in an off direction from a {0001} plane. The off direction is a [11-20] direction, for example. Stated another way, a step flow direction of silicon carbide epitaxial layer 24 is the [11-20] direction. The off angle is 4°, for example. Silicon carbide single-crystal substrate 11 forms second main surface 2. Silicon carbide single-crystal substrate 11 has first p type regions 22 and a first n type region 31. Each first p type region 22 includes a p type impurity such as aluminum, and has p type conductivity. The concentration of the p type impurity in p type region 22 exceeds $1 \times 10^{19}$ $cm^{-3}$, and is not more than $1 \times 10^{21}$ $cm^{-3}$. First p type region 22 is formed by ion implantation, for example. First p type region 22 is in contact with silicon carbide epitaxial layer 24. First p type region 22 is spaced from second main surface 2. First n type region 31 includes an n type impurity such as nitrogen, and has n type conductivity.

Silicon carbide substrate 10 has second p type regions 32, a third p type region 33, a fourth p type region 34, a fifth p type region 35, and a second n type region 39. Second p type regions 32, third p type region 33, fourth p type region 34 and fifth p type region 35 each include a p type impurity such as aluminum, and has p type conductivity. Second n type region 39 includes an n type impurity such as nitrogen, and has n type conductivity. The concentration of the p type impurity included in second p type region 32 is substantially equal to the concentration of the p type impurity included in third p type region 33. The concentration of the p type impurity included in fourth p type region 34 is substantially equal to the concentration of the p type impurity included in fifth p type region 35. The concentration of the p type impurity included in third p type region 33 may be higher than the concentration of the p type impurity included in fourth p type region 34.

Each second p type region 32 is in contact with Schottky electrode 42 at first main surface 1. A side surface and a bottom surface of second p type region 32 are in contact with second n type region 39. Third p type region 33 is in contact with Schottky electrode 42 at first main surface 1. A side surface and a bottom surface of third p type region 33 are in contact with fourth p type region 34. Fourth p type region 34 is in contact with Schottky electrode 42 and field oxide film 36 at first main surface 1. A side surface and a bottom surface of fourth p type region 34 are in contact with second n type region 39. Fifth p type region 35 is in contact with field oxide film 36 at first main surface 1. A side surface and a bottom surface of fifth p type region 35 are in contact with second n type region 39.

As shown in FIG. 21, first p type region 22 is configured to be able to prevent a basal plane dislocation 29 extending in silicon carbide single-crystal substrate 11 from being transferred to silicon carbide epitaxial layer 24. Specifically, first p type region 22 is disposed within silicon carbide single-crystal substrate 11 such that basal plane dislocation 29 does not propagate to second p type region 32 of silicon carbide epitaxial layer 24. Basal plane dislocation 29 propagates in a <11-20> direction, for example. That is, first p type region 22 and second p type region 32 are disposed on a line parallel to the [11-20] direction.

A width 61 of first p type region 22 is not less than 2 μm and not more than 3 μm, for example. A thickness 62 of first p type region 22 is not less than 0.7 μm and not more than 1.3 μm, for example. A thickness 68 of silicon carbide single-crystal substrate 11 is 200 μm, for example. A width 63 of second p type region 32 is 2 μm, for example. A spacing 64 between two adjacent second p type regions 32 is 4 μm, for example. The thickness of second p type region 32 is 0.8 μm, for example. A thickness 67 of silicon carbide epitaxial layer 24 is not less than 10 μm and not more than 30 μm, for example.

Schottky electrode 42 is provided on first main surface 1. Schottky electrode 42 is stacked film of titanium (Ti) and titanium nitride (TiN), for example. The thickness of the titanium is 0.1 μm, for example. The thickness of the titanium nitride is 0.15 μm, for example. Schottky electrode 42 extends up onto part of field oxide film 36. The thickness of field oxide film 36 is 1 μm, for example. Passivation film 37 is provided on anode electrode 38 and field oxide film 36. Anode electrode 38 is made of AlSiCu, for example. Cathode electrode 41 is in contact with silicon carbide single-crystal substrate 11 at second main surface 2.

Figure 22:
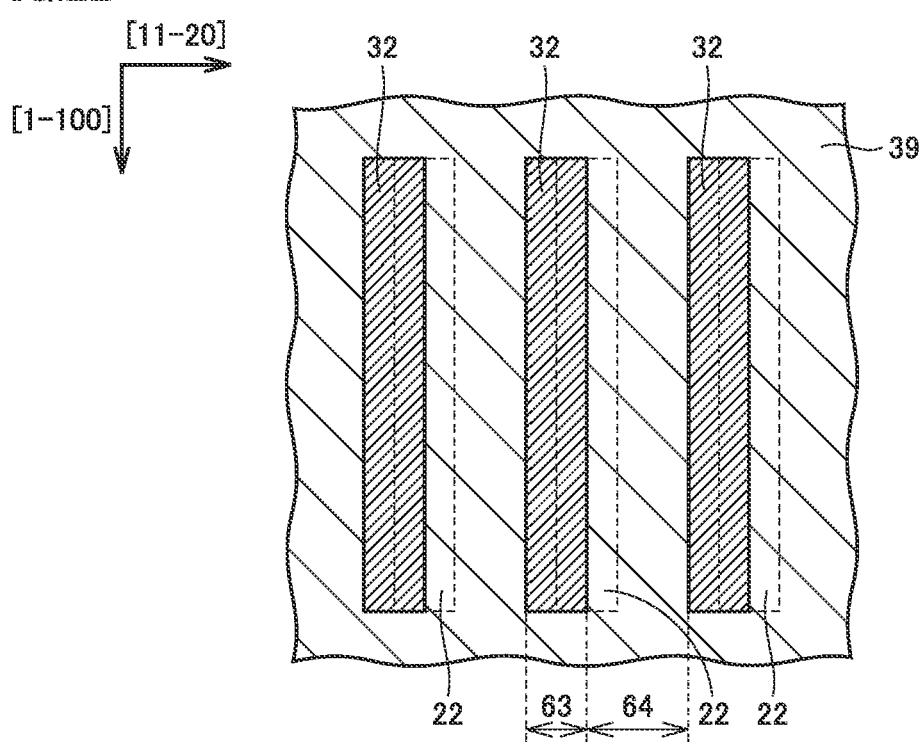
FIG. 22 is a schematic cross-sectional view taken along the line XXII-XXII in a direction of arrows in FIG. 21.

As shown in FIG. 22, when viewed in the direction perpendicular to first main surface 1, the direction in which first p type region 22 and second p type region 32 extend (longitudinal direction) is a [1-100] direction perpendicular to the [11-20] direction, for example. When viewed in the direction perpendicular to first main surface 1, the width of first p type region 22 in the [11-20] direction is smaller than the width of first p type region 22 in the [1-100] direction perpendicular to the [11-20] direction. When viewed in the direction perpendicular to first main surface 1, first p type region 22 is shifted in the [11-20] direction relative to second p type region 32. When viewed in the direction perpendicular to first main surface 1, first p type region 22 may partially overlap second p type region 32, or may not overlap at all.

(Variation 9)

Next, a configuration of silicon carbide semiconductor device 100 according to Variation 9 is described. The configuration of JBS 100 according to Variation 9 is different from the configuration of the JBS according to Variation 8 in the following respects, and is otherwise substantially the same as the configuration of the JBS according to Variation 8.

Figure 23:
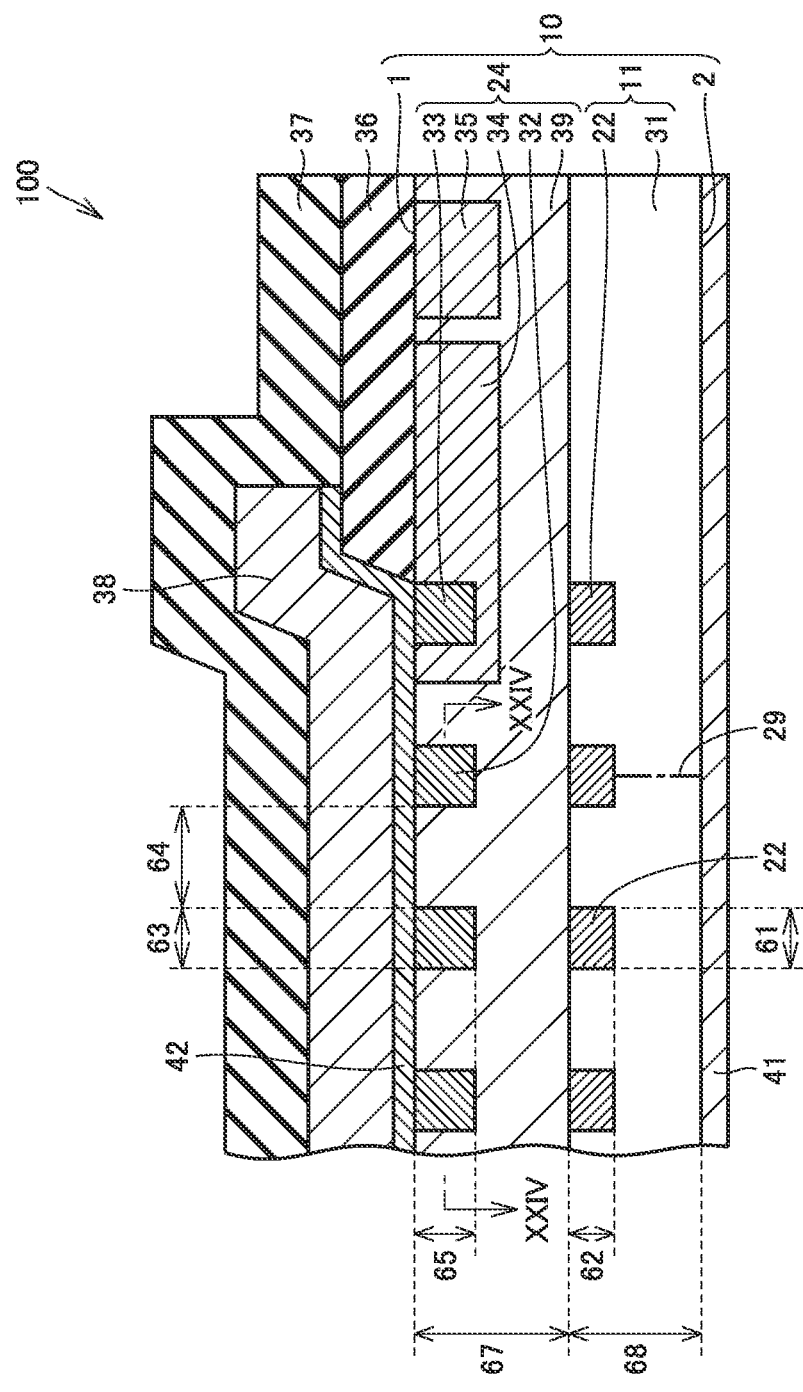
FIG. 23 is a schematic cross-sectional view showing a configuration of the silicon carbide semiconductor device according to Variation 9.

As shown in FIG. 23, when viewed in the direction parallel to first main surface 1, basal plane dislocation 29 extends in a direction substantially perpendicular to first main surface 1. First p type region 22 is disposed within silicon carbide single-crystal substrate 11 to face second p type region 32, so as to hinder the propagation of basal plane dislocation 29 from second main surface 2 toward second p type region 32. First p type region 22 and second p type region 32 are disposed on a line perpendicular to first main surface 1.

Figure 24:
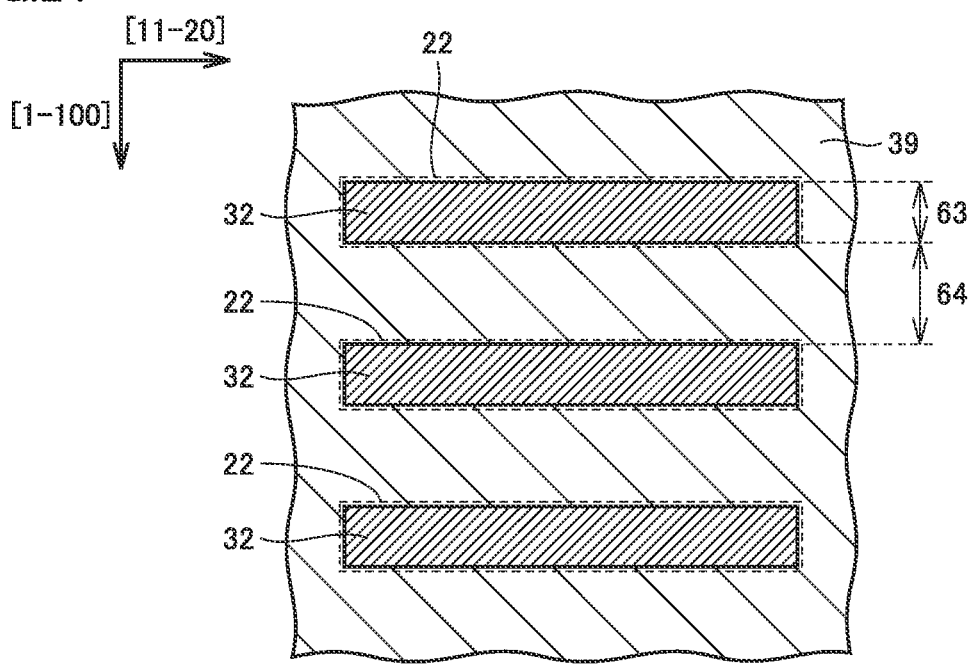
FIG. 24 is a schematic cross-sectional view taken along the line XXIV-XXIV in a direction of arrows in FIG. 23.

As shown in FIG. 24, when viewed in the direction perpendicular to first main surface 1, the direction in which first p type region 22 and second p type region 32 extend (longitudinal direction) is the [1-100] direction, for example. When viewed in the direction perpendicular to first main surface 1, the width of first p type region 22 in the [11-20] direction is greater than the width of first p type region 22 in the [1-100] direction perpendicular to the [11-20] direction. When viewed in the direction perpendicular to first main surface 1, first p type region 22 substantially completely overlaps second p type region 32.

(Evaluation)

(Preparation of Samples)

First, silicon carbide substrates 10 according to Samples 1 to 6 were prepared. Silicon carbide substrates 10 according to Samples 1 to 5 each has silicon carbide single-crystal substrate 11, first impurity region 21, p type region 22, and third impurity region 23. First impurity region 21 is on silicon carbide single-crystal substrate 11, and has n type conductivity. The thickness of first impurity region 21 is 9 μm. P type region 22 is on first impurity region 21. The thickness of p type region 22 is 0.7 μm. Third impurity region 23 is on p type region 22. The thickness of third impurity region 23 is 3 μm. The concentrations of aluminum atoms (impurity concentrations) in p type region 22 according to Samples 1, 2, 3, 4, 5 and 6 are less than $1 \times 10^{16}$ cm$^{-3}$, not less than $1 \times 10^{16}$ cm$^{-3}$ and less than $1 \times 10^{17}$ cm$^{-3}$, not less than $1 \times 10^{17}$ cm$^{-3}$ and less than $1 \times 10^{18}$ cm$^{-3}$, not less than $1 \times 10^{18}$ cm$^{-3}$ and less than $1 \times 10^{19}$ cm$^{-3}$, not less than $1 \times 10^{19}$ cm$^{-3}$ and less than $1 \times 10^{20}$ cm$^{-3}$, and not less than $1 \times 10^{20}$ cm$^{-3}$, respectively. The concentration of aluminum atoms in p type region 22 was adjusted by controlling a dose amount during ion implantation.

Figure 25:
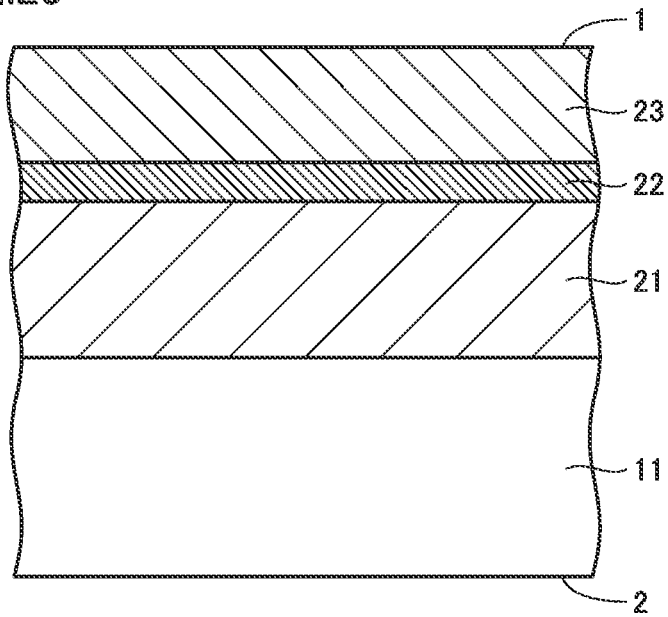
FIG. 25 is a schematic cross-sectional view showing a structure of a silicon carbide substrate 10 according to each of Samples 2 and 4 to 6.
Figure 26:
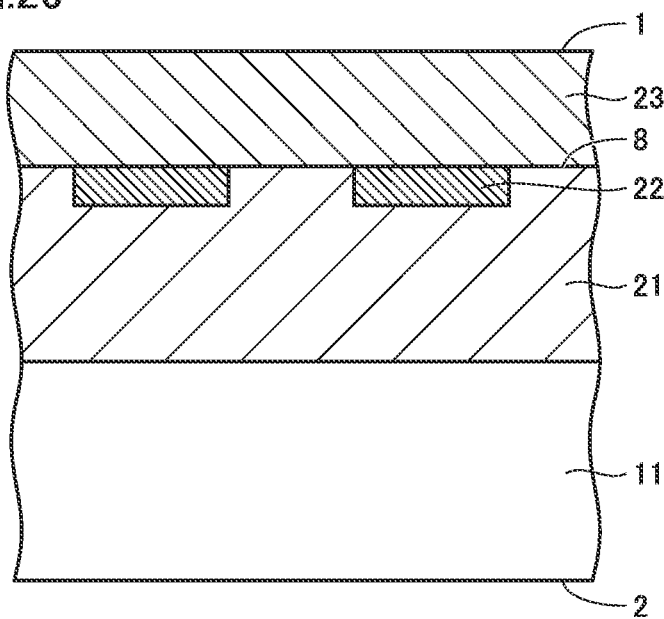
FIG. 26 is a schematic cross-sectional view showing a structure of silicon carbide substrate 10 according to each of Samples 1 and 3.

Silicon carbide substrates 10 according to Samples 2 and 4 to 6 each have a structure shown in FIG. 25. That is, p type region 22 is provided on the entire surface of first impurity region 21. Silicon carbide substrates 10 according to Samples 1 and 3 each have a structure shown in FIG. 26. That is, p type regions 22 are provided only partially on the surface of first impurity region 21. The width of each p type region 22 is about 6 to 7 μm. A pitch of p type regions 22 is about 10 μm.

(Method of Measuring Defect Density)

A defect density in silicon carbide substrate 10 according to each sample was measured using a confocal differential interference microscope. As the confocal differential interference microscope, the WASAVI series SICA manufactured by Lasertec Corporation was used. A pit having an opening width of not less than 2 μm and a depth of not less than 10 nm was counted as a defect. An observed area of 1 mm×1 mm was set. The defect density was determined by dividing the number of defects in the observed area by the area of a measured area.

(Results of Measurement of Defect Density)

Figure 27:
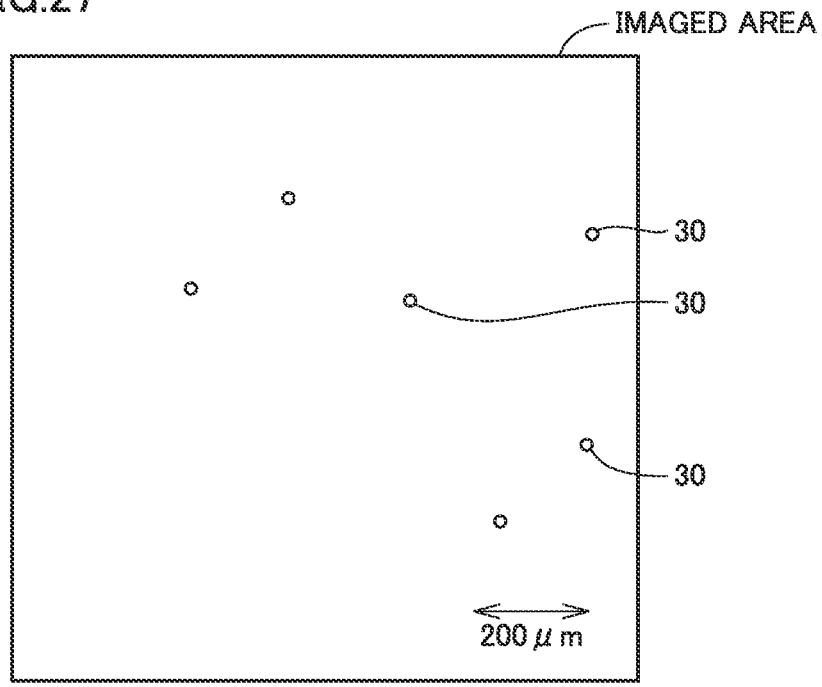
FIG. 27 shows an image taken at a first main surface of silicon carbide substrate 10 according to Sample 3.
Figure 28:
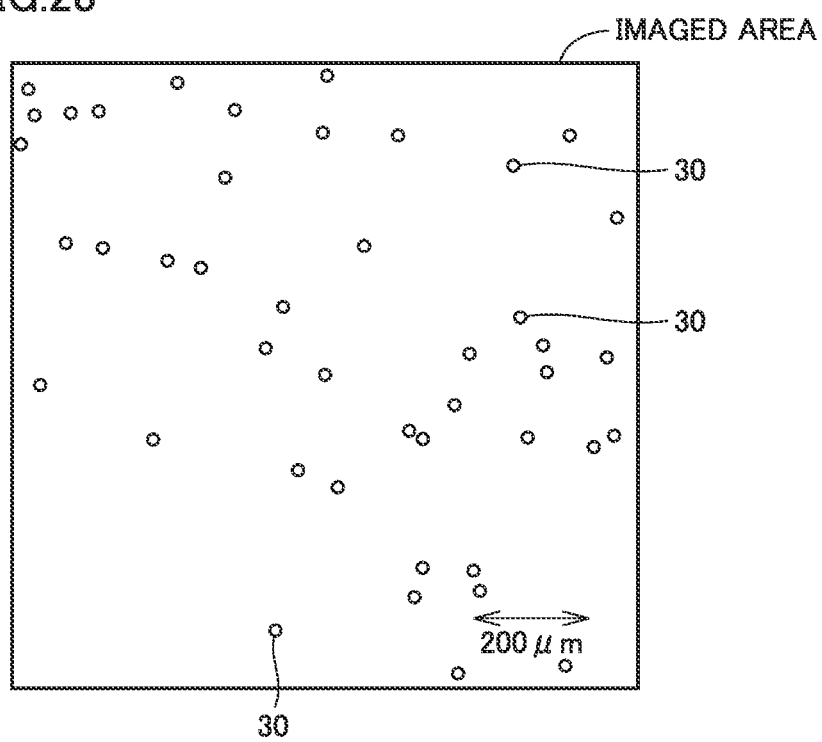
FIG. 28 shows an image taken at a surface of a p type region of silicon carbide substrate 10 according to Sample 1.

In an area imaged at first main surface 1 of silicon carbide substrate 10 according to Sample 1, there are no defects, or the defects are too shallow, if any, to be observed. FIG. 27 shows an image taken at a portion of first main surface 1 which faces p type region 22 of silicon carbide substrate 10 according to Sample 3. As shown in FIG. 27, defects 30 are present at low densities in the imaged area. The number of defects 30 measured in the imaged area is 6. The density of defects 30 is about 600 defects/cm$^2$. FIG. 28 shows an image taken at a surface of p type region 22 when there is no third impurity region 23 of silicon carbide substrate 10 according to Sample 1. As shown in FIG. 28, defects 30 are present at high densities in the imaged area. The number of defects 30 measured in the imaged area is 44. The density of defects 30 is about 4400 defects/cm$^2$.

Table 1 shows relation between the impurity concentration (concentration of aluminum atoms) and the defect density. In Table 1, "A", "B", "C" and "D" indicate that the defect density is extremely low (specifically, not more than 5 defects/cm$^2$), the defect density is low, the defect density is moderate, and the defect density is high, respectively.

TABLE 1

| Sample | Impurity concentration (cm$^{-3}$) | Defect density (defects/cm$^2$) |
| --- | --- | --- |
| 1 | less than 1 × 10$^{16}$ | D |
| 2 | not less than 1 × 10$^{16}$ and less than 1 × 10$^{17}$ | C |
| 3 | not less than 1 × 10$^{17}$ and less than 1 × 10$^{18}$ | B |
| 4 | not less than 1 × 10$^{18}$ and less than 1 × 10$^{19}$ | B |
| 5 | not less than 1 × 10$^{19}$ and less than 1 × 10$^{20}$ | A |
| 6 | not less than 1 × 10$^{20}$ | A |

As shown in Table 1, the defect density is lowered by increasing the impurity concentration of p type region 22. Specifically, it was confirmed that the defect density in first main surface 1 of silicon carbide substrate 10 could be reduced to extremely low level by setting the impurity concentration of p type region 22 at not less than 1×10$^{19}$ cm$^{-3}$.

It should be understood that the embodiments disclosed herein are illustrative and non-restrictive in every respect. The scope of the present disclosure is defined by the terms of the claims, rather than the description above, and is intended to include any modifications within the meaning and scope equivalent to the terms of the claims.

REFERENCE SIGNS LIST 1 main surface (first main surface, surface); 2 second main surface; 3 side surface; 4 bottom surface; 5, 26 outer edge; 6 trench; 7 opening; 8 surface; 9 threading screw dislocation; 10 silicon carbide substrate; 11 silicon carbide single-crystal substrate; 12 drift region; 13 body region (p type layer); 14 source region; 15 gate insulating film; 16 source electrode; 17 mask; 18 contact region; 19 source wire; 20 drain electrode; 21 first impurity region; 22 p type region (second impurity region, first p type region); 23 third impurity region; 24 silicon carbide epitaxial layer; 25 interlayer insulating film; 27 gate electrode; 29 basal plane dislocation; 30 defect; 31 first n type region; 32 second p type region; 33 third p type region; 34 fourth p type region; 35 fifth p type region; 36 field oxide film; 37 passivation film; 38 anode electrode; 39 second n type region; 41 cathode electrode; 42 Schottky electrode; 50 transverse direction; 60 longitudinal direction; 100 MOSFET (silicon carbide semiconductor device).

The invention claimed is:

1. A silicon carbide semiconductor device comprising:
    a silicon carbide substrate having a main surface; and
    a gate insulating film on the silicon carbide substrate,
    the silicon carbide substrate including
        a first impurity region having n type,
        a second impurity region in contact with the first impurity region and having p type,
        a third impurity region, on the first impurity region and the second impurity region, having an impurity concentration higher than that of the first impurity region, and having n type,
        a body region on the third impurity region and having p type, and
        a source region, on the body region, separated from the third impurity region by the body region, and having n type, wherein
    the main surface is provided with a trench defined by a side surface and a bottom surface continuous with the side surface,
    the gate insulating film is in contact with the source region, the body region and the third impurity region at the side surface, and is in contact with the third impurity region at the bottom surface,
    when viewed in a direction perpendicular to the main surface, the second impurity region contains the bottom surface, and an area of the second impurity region is greater than an area of the bottom surface, and is not more than three times the area of the bottom surface, and
    an impurity concentration of the second impurity region exceeds 1×10$^{19}$ cm$^{-3}$, and is not more than 1×10$^{21}$ cm$^{-3}$.

2. The silicon carbide semiconductor device according to claim 1, wherein
    when viewed in the direction perpendicular to the main surface, an outer edge of the second impurity region is spaced from an outer edge of the bottom surface around an entire periphery of the bottom surface.

3. The silicon carbide semiconductor device according to claim 1, wherein
    a thickness of the second impurity region in the direction perpendicular to the main surface is not less than 0.7 μm.

4. The silicon carbide semiconductor device according to claim 1, wherein
    in a direction parallel to the main surface, a width of an opening in the trench is greater than a width of the bottom surface and smaller than a width of the second impurity region.

5. The silicon carbide semiconductor device according to claim 1, wherein
in a direction parallel to the main surface, a width of the second impurity region is greater than a width of the bottom surface and smaller than a width of an opening in the trench.

6. A silicon carbide semiconductor device comprising:
a silicon carbide substrate having a main surface; and
a gate insulating film on the silicon carbide substrate,
the silicon carbide substrate including
a first impurity region having n type,
a second impurity region in contact with the first impurity region and having p type,
a third impurity region, on the first impurity region and the second impurity region, having an impurity concentration higher than that of the first impurity region, and having n type,
a body region on the third impurity region and having p type, and
a source region, on the body region, separated from the third impurity region by the body region, and having n type, wherein
the main surface is provided with a trench defined by a side surface and a bottom surface continuous with the side surface,
the gate insulating film is in contact with the source region, the body region and the third impurity region at the side surface, and is in contact with the third impurity region at the bottom surface,
when viewed in a direction perpendicular to the main surface, the second impurity region contains the bottom surface, and an area of the second impurity region is greater than an area of the bottom surface, and is not more than three times the area of the bottom surface,
an impurity concentration of the second impurity region exceeds $1\times10^{19}$ cm$^{-3}$, and is not more than $1\times10^{21}$ cm$^{-3}$,
when viewed in the direction perpendicular to the main surface, an outer edge of the second impurity region is spaced from an outer edge of the bottom surface around an entire periphery of the bottom surface, and
in a direction parallel to the main surface, a width of an opening in the trench is greater than a width of the bottom surface and smaller than a width of the second impurity region.

7. A silicon carbide semiconductor device comprising:
a silicon carbide substrate having a main surface; and
a gate insulating film on the silicon carbide substrate,
the silicon carbide substrate including
a first impurity region having n type,
a second impurity region in contact with the first impurity region and having p type,
a third impurity region, on the first impurity region and the second impurity region, having an impurity concentration higher than that of the first impurity region, and having n type,
a body region on the third impurity region and having p type, and
a source region, on the body region, separated from the third impurity region by the body region, and having n type, wherein
the main surface is provided with a trench defined by a side surface and a bottom surface continuous with the side surface,
the gate insulating film is in contact with the source region, the body region and the third impurity region at the side surface, and is in contact with the third impurity region at the bottom surface,
when viewed in a direction perpendicular to the main surface, the second impurity region contains the bottom surface, and an area of the second impurity region is greater than an area of the bottom surface, and is not more than three times the area of the bottom surface,
an impurity concentration of the second impurity region exceeds $1\times10^{19}$ cm$^{-3}$, and is not more than $1\times10^{21}$ cm$^{-3}$,
when viewed in the direction perpendicular to the main surface, an outer edge of the second impurity region is spaced from an outer edge of the bottom surface around an entire periphery of the bottom surface, and
in a direction parallel to the main surface, a width of the second impurity region is greater than a width of the bottom surface and smaller than a width of an opening in the trench.

* * * * *